United States Patent
Esmael

(10) Patent No.: US 11,764,738 B2
(45) Date of Patent: Sep. 19, 2023

(54) SEGMENTED POWER AMPLIFIER ARRANGEMENTS WITH FEEDFORWARD ADAPTIVE BIAS CIRCUITS

(71) Applicant: Analog Devices International Unlimited Company, Limerick (IE)

(72) Inventor: Mohamed Moussa Ramadan Esmael, American Project (EG)

(73) Assignee: Analog Devices International Unlimited Company, Limerick (IE)

( * ) Notice: Subject to any disclaimer, the term of this patent is extended or adjusted under 35 U.S.C. 154(b) by 216 days.

(21) Appl. No.: 17/031,026

(22) Filed: Sep. 24, 2020

(65) Prior Publication Data

US 2022/0094306 A1  Mar. 24, 2022

(51) Int. Cl.
*H03F 1/32* (2006.01)
*H03F 3/21* (2006.01)

(52) U.S. Cl.
CPC ........... *H03F 1/3205* (2013.01); *H03F 3/211* (2013.01); *H03F 2200/222* (2013.01); *H03F 2200/387* (2013.01); *H03F 2200/451* (2013.01)

(58) Field of Classification Search
CPC .. H03F 1/3205; H03F 3/211; H03F 2200/222; H03F 2200/387; H03F 2200/451
USPC ......................................................... 330/295
See application file for complete search history.

(56) References Cited

U.S. PATENT DOCUMENTS

| | | | |
|---|---|---|---|
| 5,548,813 A * | 8/1996 | Charas | H04B 7/10 343/890 |
| 6,175,551 B1 | 1/2001 | Awater et al. | |
| 6,782,244 B2 | 8/2004 | Steel et al. | |
| 7,697,591 B2 | 4/2010 | Copeland | |
| 7,863,976 B1 | 1/2011 | Loeb et al. | |
| 8,044,716 B1 | 10/2011 | Loeb et al. | |
| 8,138,829 B2 | 3/2012 | Reddy et al. | |
| 9,660,675 B2 | 5/2017 | Pratt | |

(Continued)

FOREIGN PATENT DOCUMENTS

GB    2330468 A  *  4/1999  ............... H03F 1/02

OTHER PUBLICATIONS

Jin et al., Linearization of CMOS Cascode Power Amplifiers Through Adaptive Bias Control, IEEE Transactions on Microwave Theory and Techniques, vol. 61, No. 12, Dec. 2013, pp. 4534-4543. (Year: 2013).*

(Continued)

*Primary Examiner* — Hafizur Rahman
(74) *Attorney, Agent, or Firm* — Knobbe, Martens, Olson & Bear, LLP

(57) ABSTRACT

Segmented power amplifier (PA) arrangements are disclosed. An example PA arrangement includes at least first and second PA segments, each having a respective combination of a PA and a feedforward adaptive bias circuit, configured to generate a bias signal for the corresponding PA. Each bias signal has a first DC component, at least one tone component, and at least one harmonic of the at least one tone component. The PA arrangement further includes a power splitting circuit, configured to split an input signal for the PA arrangement into a first PA input signal for the first PA segment and a second PA input signal for the second PA segment, where a power of the first PA input signal is greater than a power of the second PA input signal.

29 Claims, 18 Drawing Sheets

(56) References Cited

U.S. PATENT DOCUMENTS

| | | |
|---|---|---|
| 9,685,918 B2 | 6/2017 | Li |
| 9,866,178 B2 | 1/2018 | Anderson |
| 10,033,413 B2 | 7/2018 | Pratt |
| 10,063,265 B2 | 8/2018 | Pratt |
| 10,097,233 B2 | 10/2018 | Pratt |
| 10,224,970 B2 | 3/2019 | Pratt |
| 10,903,806 B2 | 1/2021 | Anderson et al. |
| 10,972,054 B2 * | 4/2021 | Maalouf .................. H03F 3/21 |
| 11,171,613 B1 | 11/2021 | Krishnaswamy et al. |
| 11,271,628 B2 | 3/2022 | Hadjichirstos et al. |
| 2007/0252646 A1 * | 11/2007 | Leung ..................... H03F 1/22 |
| | | 330/136 |
| 2014/0085001 A1 | 3/2014 | Anderson et al. |
| 2014/0169496 A1 | 6/2014 | Yang et al. |
| 2015/0194940 A1 | 7/2015 | Briffa et al. |
| 2016/0149543 A1 | 5/2016 | Anderson et al. |
| 2017/0257070 A1 | 9/2017 | Modi et al. |
| 2017/0338841 A1 | 11/2017 | Pratt |
| 2017/0338842 A1 | 11/2017 | Pratt |
| 2018/0167091 A1 | 6/2018 | Pratt et al. |
| 2018/0191314 A1 | 7/2018 | Pratt et al. |
| 2018/0309465 A1 | 10/2018 | Pratt |
| 2019/0158045 A1 | 5/2019 | Zampardi, Jr. et al. |
| 2019/0273469 A1 | 9/2019 | Li |
| 2020/0395894 A1 | 12/2020 | Esmael |
| 2021/0050818 A1 | 2/2021 | Buckwalter et al. |
| 2021/0242835 A1 | 8/2021 | Mobarak et al. |
| 2022/0021430 A1 | 1/2022 | Hadjichirstos et al. |
| 2022/0131509 A1 | 4/2022 | Ning et al. |

OTHER PUBLICATIONS

Wood, J, et al., "On the Modeling of LDMOS RF Power Transistors" 978-1-4244-5760-1/10/$26.00 © 2010 IEEE (Year: 2010).*

S.J.C.H. Theeuwen et al., "S-band radar LDMOS transistors", Proceedings of the 3rd European Microwave Integrated Circuits Conference, Oct. 2008, Amsterdam, The Netherlands. 978-2-87487-007-1 © 2008 EuMA. (Year: 2008).*

Vasjanov et al., *A Review of Advanced CMOS RF Power Amplifier Architecture Trends for Low Power 5G Wireless Networks*, MDPI Electronics, 2018, 7, 271; doi:10.3390/electronics7110271, www.mdpi.com/journal/electronics, 17 pages.

Chen et al., *A High-Efficiency CMOS RF Power Amplifier with Automatic Adaptive Bias Control*, IEEE Microwave and Wireless Components Letter, Dec. 2006, 4 pages.

Carvalho et al., *Gain Compression or Expansion, Distortion and Other Large Signal Power Amplifier Related Phenomena*, published 1999, 4 pages.

Collins et al., *Nonlinear Analysis of Power Amplifiers*, Microwave Journal, Sep. 2007, 6 pages.

Feucht, *High-Efficiency Analog Amplifiers, Part 3: Optimal Parallel-Segmented Voltages*, Planet Analog, All Signal, No Noise, Mar. 5, 2019, 5 pages.

Niknejad, *Power Amplifiers for Communications*, Integrated Circuits for Communication, Berkeley, © 2014, 50 pages.

Beek, *Multi-carrier single-DAC transmitter approach applied to digital cable television*, Eindhoven University of Technology, Jan. 1, 2011, DOI: 10.6100/IR716353, 327 pages.

Pratt et al., *Ultrawideband Digital Predistortion (DPD): The Rewards (Power and Performance) and Challenges of Implementation in Cable Distribution Systems*, Analog Devices, AnalogDialogue 51-07, Jul. 2017, 7 pages.

* cited by examiner

SEGMENTED POWER AMPLIFIER ARRANGEMENTS WITH FEEDFORWARD ADAPTIVE BIAS CIRCUITS

TECHNICAL FIELD OF THE DISCLOSURE

The present disclosure generally relates to radio frequency (RF) systems and, more particularly, to power amplifiers of RF systems.

BACKGROUND

Radio systems are systems that transmit and receive signals in the form of electromagnetic waves in the RF range of approximately 3 kilohertz (kHz) to 300 Gigahertz (GHz). Radio systems are commonly used for wireless communications, with cellular/wireless mobile technology being a prominent example but may also be used for cable communications such as cable television. In both types of systems, linearity of various components therein plays a crucial role.

Linearity of an RF component or a system is easy to understand in theory. Namely, linearity generally refers to the ability of a component or a system to provide an output signal that is directly proportional to an input signal. In other words, if a component or a system is perfectly linear, the relationship of a ratio of the output signal to the input signal is a straight line. Achieving this behavior in real-life components and systems is far more complicated and many challenges to linearity must be resolved, often at the expense of some other performance parameter, such as efficiency.

Made from semiconductor materials, which are inherently nonlinear, and having to operate at relatively high power levels, power amplifiers are usually the first components to analyze when considering a design of an RF system in terms of linearity. Power amplifier outputs with nonlinear distortions can result in reduced modulation accuracy (e.g., reduced error vector magnitude (EVM)) and/or out-of-band emissions. Therefore, both wireless communication systems (e.g., Long Term Evolution (LTE) and $5^{th}$ generation (5G) systems) and cable communication systems have stringent specifications on power amplifier linearity.

While linearity is also important for small-signal amplifiers such as low-noise amplifiers, the challenges of linearity are particularly pronounced for power amplifiers because such amplifiers are typically required to produce relatively high output power levels and are, therefore, particularly susceptible to entering certain operating conditions where nonlinear behavior can no longer be ignored. On one hand, the nonlinear behavior of semiconductor materials used to form amplifiers tends to worsen when the amplifiers operate on signals with high power levels (an operating condition commonly referred to as "operating in saturation"), increasing the amount of nonlinear distortions in their output signals, which is highly undesirable. On the other hand, amplifiers operating in saturation also typically function at their highest efficiency, which is highly desirable.

As the foregoing illustrates, linearity and efficiency are two performance parameters for which oftentimes an acceptable trade-off has to be found in that improvements in terms of one of these parameters comes at the expense of the other parameter being less than optimal. To that end, the term "back-off" is used in the art to describe a measure of how far the input power (i.e., the power of a signal provided to the amplifier to be amplified) should be reduced in order to realize the desired output linearity (e.g., back-off may be measured as a ratio between the input power that delivers maximum power to the input power that delivers the desired linearity). Amplifiers, in particular power amplifiers, that are both linear and efficient (i.e., in which the back-off can be minimized or eliminated) are essential for modern communication systems. Therefore, further improvements with respect to the amplifier design and operation are always desirable.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

DESCRIPTION OF EXAMPLE EMBODIMENTS OF THE DISCLOSURE

Overview

Figure 1:
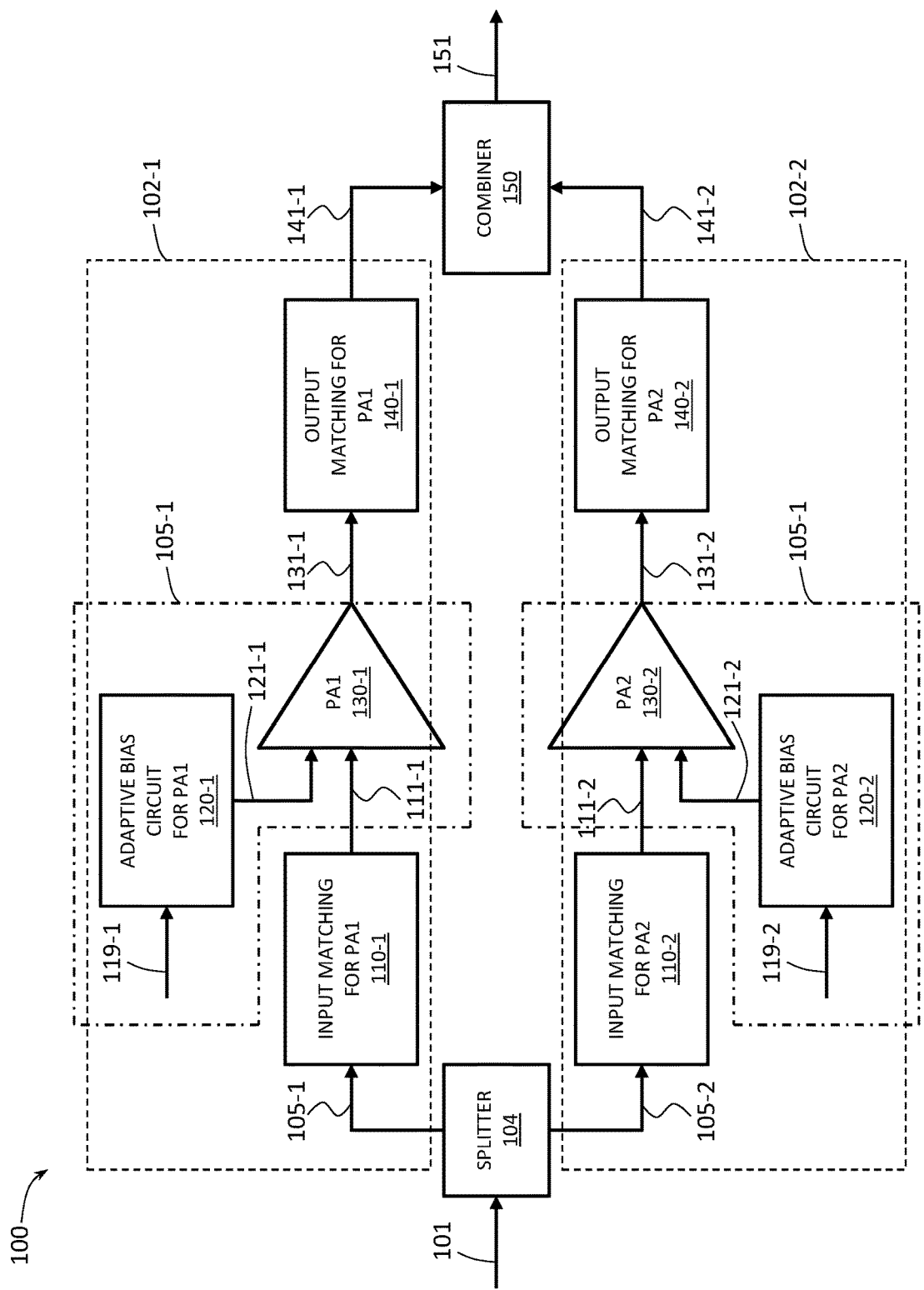
FIG. 1 provides a block diagram illustrating a segmented power amplifier (PA) arrangement with feedforward adaptive bias circuits, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating bias arrangements for amplifiers of wireless and cable communication systems, proposed herein, it might be useful to first understand phenomena that may come into play in such systems. The following foundational information may be viewed as a basis from which the present disclosure may be properly explained. Such information is offered for purposes of explanation only and, accordingly, should not be construed in any way to limit the broad scope of the present disclosure and its potential applications. While some of the following descriptions may be provided for the example of an amplifier being a power amplifier, embodiments of the present disclosure are equally applicable to other types of amplifiers such as low-noise amplifiers, variable gain amplifiers, etc.

In context of wireless radio systems, an antenna is a device that serves as an interface between radio waves propagating wirelessly through space and electric currents moving in metal conductors used with a transmitter or a receiver. During transmission, a radio transmitter may supply an electric signal, which signal is amplified by a power amplifier, and an amplified version of the signal is provided to antenna's terminals. The antenna may then radiate the energy from the signal output by the power amplifier as radio waves. Similarly, in cable radio systems, an electric signal is first amplified by a power amplifier, prior to transmission over a wired cable connection. Therefore, linear and efficient power amplifiers are essential both for wireless and for cable communication systems.

One approach to improving linearity of power amplifiers includes carefully controlling the bias signals provided thereto. For example, adaptive bias circuits have been developed to optimize linearity of power amplifiers. Such circuits are "adaptive" in that a bias signal provided to a power amplifier is made dependent on a signal that is to be amplified by a power amplifier, which may be advantageous in terms of improving linearity of the power amplifier. In another example, bias circuits have been developed which include one or more linearization transistors in addition to mirroring transistors. However, the inventor of the present disclosure realized that conventional adaptive/linearization biasing techniques and circuits may still have drawbacks that may render them sub-optimal for the latest communication systems such as 5G systems. For example, conventional adaptive/linearization biasing techniques and circuits can be sensitive to process, voltage, and temperature (PVT) variations, may have a limited envelope bandwidth, and may not always be suitable for power amplifiers that utilize stacked transistors.

Various embodiments of the present disclosure provide systems and methods that aim to improve on one or more of the drawbacks described above in providing linear and efficient amplifiers (such as, but not limited to, power amplifiers, low-noise amplifiers, or variable gain amplifiers) for RF systems (such as, but not limited to, phased antenna arrays of 5G cellular technology or cable communication systems). In one aspect of the present disclosure, an example PA arrangement includes at least a first and a second PA segments (hence, the PA arrangement is a segmented PA arrangement), each having a respective combination of a PA (which may also be referred to as a "PA core") and an adaptive bias circuit, configured to generate a bias signal for the corresponding PA. Each bias signal has a first DC component (i.e., a component with zero frequency), at least one tone component (i.e., a component with a non-zero frequency or a narrow band of non-zero frequencies, e.g., a component with a frequency or a narrow band of frequencies from the RF spectrum), and at least one harmonic of the at least one tone component (e.g., a second or a higher-order harmonic of the tone component). The PA arrangement further includes a power splitting circuit, configured to split an input signal for the PA arrangement into a first PA input signal, provided to the first PA segment, and a second PA input signal, provided to the second PA segment, where a power of the first PA input signal is greater than a power of the second PA input signal. Each adaptive bias circuit is a feedforward circuit, i.e., an adaptive bias circuit configured to generate a bias signal that adapts (e.g., changes proportionally) to the input power level of the PA segment, and is placed at the input to the PA segment. The PA arrangement also includes a combiner, configured to combine an output of the first PA and an output of the second PA to generate a combined output signal.

The exact design of segmented PA arrangements with feedforward adaptive bias circuits described herein may be realized in many ways, all of which being within the scope of the present disclosure. In one example of design variations according to various embodiments of the present disclosure, a choice can be made, individually for each of the transistors of a segmented PA arrangement with feedforward adaptive bias circuits according to any of the embodiments described herein, to employ bipolar transistors (e.g., where various transistors may be NPN or PNP transistors), field-effect transistors (FETs), e.g., metal-oxide-semiconductor (MOS) technology transistors (e.g., where various transistors may be N-type MOS (NMOS) or P-type MOS (PMOS) transistors), or a combination of one or more FETs and one or more bipolar transistors. In view of that, in the following descriptions, transistors are sometimes described with reference to their first, second, and third terminals. The term "first terminal" (T1) of a transistor may be used to refer to a base terminal if the transistor is a bipolar transistor or to a gate terminal if the transistor is a FET, the term "second terminal" (T2) of a transistor may be used to refer to a collector terminal if the transistor is a bipolar transistor or to a drain terminal if the transistor is a FET, and the term "third terminal" (T3) of a transistor may be used to refer to an emitter terminal if the transistor is a bipolar transistor or to a source terminal if the transistor is a FET. These terms remain the same irrespective of whether a transistor of a given technology is an N-type transistor (e.g., an NPN transistor if the transistor is a bipolar transistor or an NMOS transistor if the transistor is a FET) or a P-type transistor (e.g., a PNP transistor if the transistor is a bipolar transistor or a PMOS transistor if the transistor is a FET). In another example, in various embodiments, a choice can be made, individually for each of the transistors of any of the segmented PA arrangements with feedforward adaptive bias circuits as described herein, as to which transistors are implemented as N-type transistors (e.g., NMOS transistors for the transistors implemented as FETs, or NPN transistors for the transistors implemented as bipolar transistors) and which transistors are implemented as P-type transistors (e.g., PMOS transistors for the transistors implemented as FETs, or PNP transistors for the transistors implemented as bipolar transistors). In yet other examples, in various embodiments, a choice can be made as to what type of transistor architecture to employ. For example, any of the transistors of the segmented PA arrangements with feedforward adaptive bias circuits as described herein that are implemented as FETs may be planar transistors or may be non-planar transistors (some examples of the latter including FinFETs, nanowire transistors or nanoribbon transistors).

As will be appreciated by one skilled in the art, aspects of the present disclosure, in particular aspects of segmented PA arrangements with feedforward adaptive bias circuits as described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "arrangement," "module," or "system." At least some of the functions described in this disclosure may be implemented as an algorithm executed by one or more hardware processing units, e.g. one or more microprocessors, of one or more computers. In various embodiments, different steps and portions of the steps of any methods described herein may be performed by different processing units. Furthermore, aspects of the present disclosure may take the form of a computer program product embodied in one or more computer-readable medium(s), preferably non-transitory, having computer-readable program code embodied, e.g., stored, thereon. In various embodiments, such a computer program may, for example, be downloaded (updated) to various devices and systems (e.g. to various components and arrangements of components of RF systems, and/or their controllers, etc.) or be stored upon manufacturing of these devices and systems.

The following detailed description presents various descriptions of specific certain embodiments. However, the innovations described herein can be embodied in a multitude of different ways, for example, as defined and covered by the claims or select examples. In the following description, reference is made to the drawings, where like reference numerals can indicate identical or functionally similar elements. It will be understood that elements illustrated in the drawings are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The description may use the phrases "in an embodiment" or "in embodiments," which may each refer to one or more of the same or different embodiments. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner. Furthermore, for the purposes of the present disclosure, the phrase "A and/or B" or notation "A/B" means (A), (B), or (A and B), while the phrase "A, B, and/or C" means (A), (B), (C), (A and B), (A and C), (B and C), or (A, B, and C). As used herein, the notation "A/B/C" means (A, B, and/or C). The term "between," when used with reference to measurement ranges, is inclusive of the ends of the measurement ranges.

Various aspects of the illustrative embodiments are described using terms commonly employed by those skilled in the art to convey the substance of their work to others skilled in the art. For example, the term "connected" means a direct electrical connection between the things that are connected, without any intermediary devices/components, while the term "coupled" means either a direct electrical connection between the things that are connected, or an indirect connection through one or more passive or active intermediary devices/components. In another example, the term "circuit" means one or more passive and/or active components that are arranged to cooperate with one another to provide a desired function. If used, the terms "substantially," "approximately," "about," etc., may be used to generally refer to being within +/−20% of a target value, e.g., within +/−10% of a target value, based on the context of a particular value as described herein or as known in the art.

General Illustration of a Segmented PA Arrangement

FIG. 1 provides a block diagram illustrating a segmented PA arrangement 100 with feedforward adaptive bias circuits, according to some embodiments of the present disclosure.

As shown in FIG. 1, the segmented PA arrangement 100 may include at least two segments: a first PA segment 102-1 and a second PA segment 102-2 (components of each segment shown in FIG. 1 within a respective dashed contour). The first PA segment 102-1 may include at least a first PA 130-1 (PA1) and a first adaptive bias circuit 120-1, configured to generate a bias signal for PA1. The second PA segment 102-2 may include at least a second PA 130-2 (PA2) and a second adaptive bias circuit 120-2, configured to generate a bias signal for PA2. In various embodiments, any of the PAs 130 may include any suitable PA, such as, but not limited to, one of a Doherty PA, a class A PA, a class B PA, a class AB PA, or a class C PA. The segmented PA arrangement 100 may also include a splitter 104, configured to split an input signal 101 for the PA arrangement into a first PA input signal 111-1, provided to PA1, and a second PA input signal 111-2, provided to PA2. In some embodiments, the segmented PA arrangement 100 may include a first input matching circuit 110-1, configured to perform input matching for PA1, and a second input matching circuit 110-2, configured to perform input matching for PA2. An input of the input matching circuit 110-1 may be coupled to the first output of the splitter 104 so that the input matching circuit 110-1 may receive a first output signal 105-1 from the splitter 104, while the output of the input matching circuit 110-1 may be coupled to the input of PA1, so that the input matching circuit 110-1 may provide the first PA input signal 111-1 to PA1. Similarly, an input of the input matching circuit 110-2 may be coupled to the second output of the splitter 104 so that the input matching circuit 110-2 may receive a second output signal 105-2 from the splitter 104, while the output of the input matching circuit 110-2 may be coupled to the input of PA2, so that the input matching circuit 110-2 may provide the second PA input signal 111-2 to PA2.

Furthermore, the segmented PA arrangement 100 may also include a combiner 150, configured to combine signals indicative of the outputs of PA1 and PA2, said outputs shown in FIG. 1 as a first PA output signal 131-1 and a second PA output signal 131-2, respectively, to generate a combined output signal 151. In some embodiments, the segmented PA arrangement 100 may include a first output matching circuit 140-1, configured to perform output matching for PA1, and a second output matching circuit 140-2, configured to perform input matching for PA2. An input of the first output matching circuit 140-1 may be coupled to the output of PA1 so that the output matching circuit 140-1 may receive the first PA output signal 131-1 from PA1, while the output of the output matching circuit 140-1 may be coupled to the first input of the combiner 150, so that the output matching circuit 140-1 may provide a signal 141-1, indicative of the first PA output signal 131-1, to the combiner 150. Similarly, an input of the second output matching circuit 140-2 may be coupled to the output of PA2 so that the output matching circuit 140-2 may receive the second PA output signal 131-2 from PA2, while the output of the output matching circuit 140-2 may be coupled to the second input of the combiner 150, so that the output matching circuit 140-2 may provide a signal 141-2, indicative of the second PA output signal 131-2, to the combiner 150.

Together, the splitter 104 and the input matching circuits 110 may be referred to as a power splitting circuit, configured to split the input signal 101 into the first PA input signal 111-1 and the second PA input signal 111-2. As described in greater detail below, in some embodiments, PA1 and/or PA2 may also include one or more components configured to cooperate with the input matching circuits 110 in splitting the power of the input signal 101 into the first and second PA input signals 111, and therefore, such components may also be seen as a part of the power splitting circuit. Furthermore, as also described in greater detail below, the output matching circuits 140 may be configured to cooperate with the power splitting circuit, the PAs 130, and the adaptive bias circuits 120, to achieve the desired characteristics of the combined output signal 151.

In various embodiments, the segmented PA arrangement 100 may be used to implement a portion included in, or may be, an RF device. Some examples of such RF devices include, but are not limited to, a mobile device (e.g., a user equipment (UE) of a wireless cellular network), a base station of a wireless cellular network, or an RF transmitter of a cable communications network.

Example Adaptive Bias Circuits

Figure 2A:
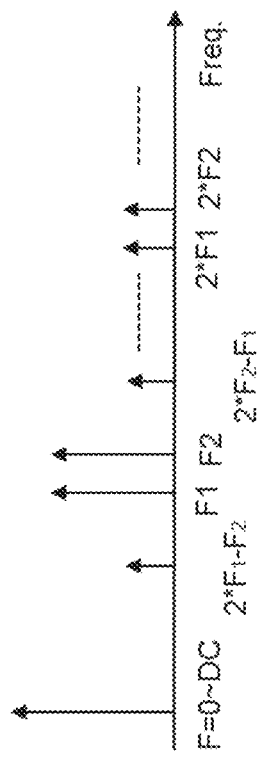
FIG. 2A provides a schematic illustration of a bias signal with DC and RF components, according to some embodiments of the present disclosure.

Each of the adaptive bias circuits 120 may be a feedforward circuit, i.e., an adaptive bias circuit configured to generate a bias signal 121 that adapts (e.g., changes proportionally) to the input power level of the respective PA, and is placed at the input to the respective PA. In some embodiments, each bias signal 121 may include a DC component and one or more RF components. For example, each bias signal 121 may include a DC component, at least one at least one tone component, and at least one harmonic of the at least one tone component. An example of such a bias signal 121 is illustrated in FIG. 2A, illustrating various bias signal components as vertical arrows arranged along a horizontal axis along which frequencies of various components are indicated. The height of the vertical arrows shown in FIG. 2A indicates relative amplitudes of the different components with respect to one another, for some embodiments of the example bias signal 121 that could be generated by any of the adaptive bias circuits 120. FIG. 2A illustrates that an example bias signal may include a DC component, shown as the left-most vertical arrow at the frequency of about 0 Hz. FIG. 2A also illustrates that the example bias signal may include two tone components, shown as components at frequencies F1 and F2, respectively, as well as various harmonics and combinations of these tone components. For example, the bias signal may include a second harmonic of the tone component of frequency F1, shown in FIG. 2A as a component at a frequency 2*F1. Similarly, the bias signal may include a second harmonic of the tone component of frequency F2, shown in FIG. 2A as a component at a frequency 2*F2. Furthermore, the bias signal may include another tone component at a frequency 2*F1-F2, and one more tone component at a frequency 2*F2-F1. The illustration of FIG. 2A provides one non-limiting example illustrating various frequency components of any of the bias signals 121, and, in various embodiments, the bias signals 121 may include more components or less components, or components at different frequencies, and/or with different amplitudes than what is shown in the example illustration of FIG. 2A, all of which being within the scope of the present disclosure.

In some embodiments, any of the adaptive bias circuits 120 may be a circuit that includes a linearization circuit in addition to a bias circuit. Bias circuits that include a single loop for biasing and linearization are known in the art. However, The inventor of the present disclosure realized that such single-loop circuits have several drawbacks, such as limited linearization that may be achieved by the linearization circuit, limited mirroring accuracy of the bias circuit, and compromised stability of the loop. Therefore, in some embodiments of the present disclosure, any of the adaptive bias circuits 120 may be a circuit that separates bias circuit transistors and linearization transistors so that they are not coupled in a single loop, which may provide improvements with respect to conventional bias arrangements that include a single loop for biasing and linearization. Some embodiments of such circuits are described with reference to FIG. 2B and FIGS. 3-7.

Figure 2B:
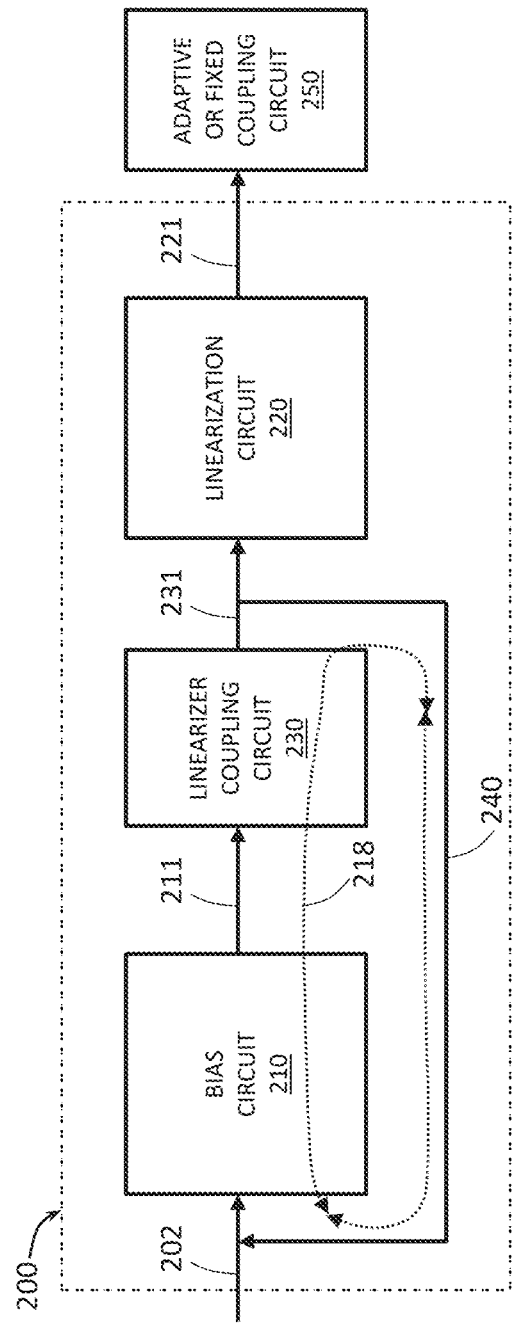
FIG. 2B provides a block diagram illustrating a bias arrangement with separate bias and linearization circuits coupled by a coupling circuit, according to some embodiments of the present disclosure.

FIG. 2B provides a block diagram illustrating a bias arrangement 200 with separate bias and linearization circuits 210, 220, coupled by a coupling circuit 230, according to some embodiments of the present disclosure. Any of the adaptive bias circuits 120 of the segmented PA arrangement 100 may be implemented as the bias arrangement 200. As shown in FIG. 2B, the bias circuit 210 may be configured to receive an input signal 202 and generate an output signal 211. The input signal 202 may be a bias signal, e.g., a bias current, and the bias circuit 210 may be configured to mirror the input signal 202 to the output, i.e., the output signal 211 may be substantially a mirrored version of the bias signal 202 or a bias voltage. The coupling circuit 230 is configured to receive the output signal 211 from the bias circuit 210 as an input to the coupling circuit 230 and provide an output signal 231, which is based on the bias signal 211 output by the bias circuit 210. The linearization circuit 220 (which may also be referred to as, simply, a "linearizer") may be configured to receive the output signal 231 from the coupling circuit 230, and generate an output signal 221, which may then be provided to an amplifier, e.g., to a power amplifier (the amplifier not shown in FIG. 2B). In particular, the linearization circuit 220 may be configured to improve linearity of the amplifier by modifying the bias signal 211 produced by the bias circuit 210 to produce the output signal 221 which may be referred to as a "modified bias signal" 221 to be provided to the amplifier. When the bias arrangement 200 is used to implement any of the adaptive bias circuits 120 of the segmented PA arrangement 100, the input signal 202 may be any of the input signals 119, provided to the adaptive bias circuits 120 as shown in FIG. 1, while the output signal 221 may be the output signal 121 generated by the adaptive bias circuits 120 as shown in FIG. 1.

As shown in FIG. 2B, the coupling circuit 230 is configured to couple the bias circuit 210 and the linearization circuit 220, and may, therefore, be referred to as a "linearizer coupling circuit" 230. Providing the separate bias and linearization circuits 210, 220 coupled to one another by the linearizer coupling circuit 230 allows separating a linearization operation from a biasing loop, which may help overcome some drawbacks of conventional bias arrangements with a single loop for biasing and linearization, provide improvements in terms of PVT variations, and achieve better linearization. A feedback path 240 may be provided, coupling the output of the linearizer coupling circuit 230 to the input of the bias circuit 202, thus forming a biasing loop 218.

In contrast to conventional bias arrangements with a single loop for biasing and linearization, the biasing loop 218 does not include the components of the linearization circuit 220. This may allow optimizing the components of the linearization circuit 220 without any bias or stability considerations/limitations, described above. Furthermore, the linearization circuit 220 may be designed without any closed loops, which may advantageously reduce or eliminate limitations of the envelope bandwidth of the bias arrangement 200.

It should be noted that, while FIG. 2B does not illustrate any additional components in the feedback path 240, in various embodiments, various active or passive components may be included therein. For example, in some embodiments, the feedback path 240 from the output of the linearizer coupling circuit 230 to the input of the bias circuit 202 may include a voltage level shifter, which may help provide a compliance voltage for the one or more transistors of the amplifier to which the modified bias signal 221 is provided (e.g., of PA1 of the segmented PA arrangement 100 shown in FIG. 1, if the bias signal 221 is the bias signal 121-1 shown in FIG. 1, or of PA2 of the segmented PA arrangement 100 shown in FIG. 1, if the bias signal 221 is the bias signal 121-2 shown in FIG. 1). Thus, in various embodiments, one or more of voltage level shifters, transistors, resistors, capacitors, amplifiers, operational amplifiers (op-amps), etc., may be coupled between the output of the linearizer coupling circuit 230 and the input of the bias circuit 202 in the feedback path 240.

In some embodiments, a coupling circuit 250 may be provided to couple the output signal 221 of the bias arrangement 200 to the amplifier that the bias signal 221 is supposed to bias. In some embodiments, the coupling circuit 250 may be a fixed coupling circuit, e.g., realized as a resistor or a capacitor. In other embodiments, the coupling circuit 250 may be an adaptive coupling circuit, configured to change the coupling strength based on some operating parameters, e.g., based on an input power. For example, in some embodiments, the coupling circuit 250 may be an adaptive coupling circuit, configured so that an impedance of the coupling circuit 250 is dependent on a power level of an input signal to be amplified by the amplifier, as is described in greater detail with reference to FIGS. 8-9. In some embodiments, the coupling circuit 250 may be a part of the bias arrangement 200.

The exact design of the bias arrangement 200 as described above may be realized in many ways, all of which being within the scope of the present disclosure. In one aspect, although not specifically shown in FIG. 2B, each of the bias circuit 210, the linearization circuit 220, and the linearizer coupling circuit 230 may include one or more transistors. Therefore, in one example of design variations according to some embodiments of the present disclosure, a choice can be made, individually for each of the bias circuit 210, the linearization circuit 220, and the linearizer coupling circuit 230, to employ FETs, bipolar transistors, or a combination of one or more FETs and one or more bipolar transistors. In another example, in various embodiments, a choice can be made, individually for each of the bias circuit 210, the linearization circuit 220, and the linearizer coupling circuit 230, to employ N-type transistors, P-type transistors, or a combination of both. In yet other examples, in various embodiments, a choice can be made as to what type of transistor architecture to employ. Other possible design variations may include implementing the output 221 of the bias arrangement 200 as an output that is provided as an input to a differential amplifier or for a single-ended amplifier, employing cascode arrangements of two or more transistors in any of the bias circuit 210, the linearization circuit 220, and the linearizer coupling circuit 230, etc. Some example implementations of the bias arrangement 200 are shown in FIGS. 3-7. However, any implementation of the bias arrangement 200 in line with the descriptions provided herein is within the scope of the present disclosure.

In FIGS. 3-7, reference numerals used in FIG. 2B indicate elements of the bias arrangements which are the same or analogous to those shown in FIG. 2B. For example, each of FIGS. 3-7 illustrates the bias circuit 210, the linearization circuit 220, and the linearizer coupling circuit 230, although the details of their specific implementation may be different in different ones of FIGS. 3-7.

Figure 3:
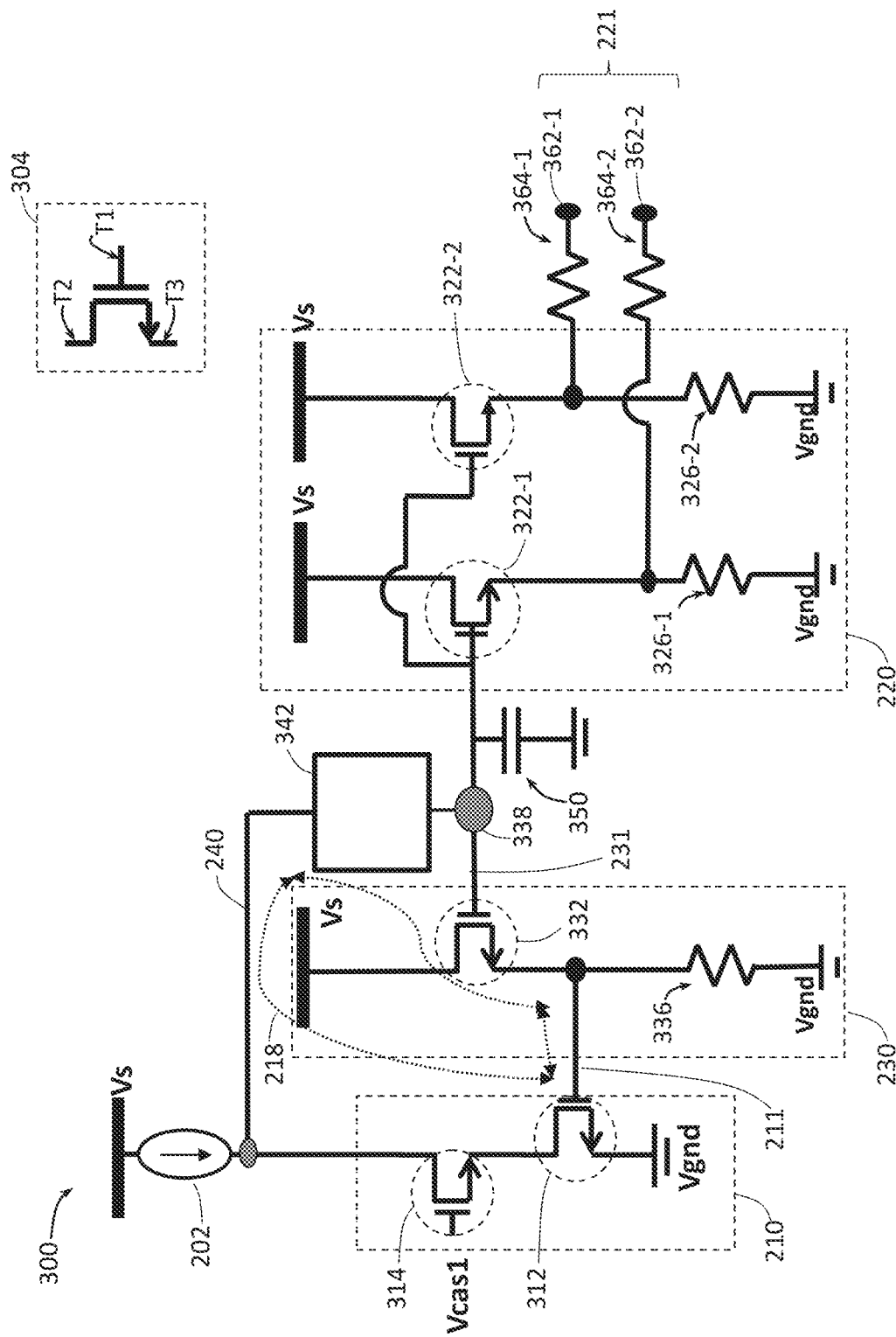
FIGS. 3-7 provide schematic illustrations of electric circuit diagrams of example implementations of the bias arrangement of FIG. 2B, according to some embodiments of the present disclosure.

FIG. 3 provides a schematic illustration of an electric circuit diagram of a bias arrangement 300, which is the first example implementation of the bias arrangement 200, according to some embodiments of the present disclosure.

In FIG. 3 and some of the subsequent drawings, various transistors are shown within their conventional electric circuit diagram notations. An inset 304, shown in the upper right corner of FIG. 3, illustrates an example transistor indicating what is referred to in the rest of the description as first, second, and third terminals, labeled as T1, T2, and T3, respectively, and is applicable to all of the present drawings. If a given transistor described herein is implemented as a FET, as is shown for various electric circuit diagrams of the present drawings, then, in accordance with the conventional nomenclature, the first terminal T1 is a gate terminal, the second terminal T2 is a drain terminal, and the third terminal T3 is a source terminal. However, any of the FETs illustrated in the present drawings may be replaced by a bipolar transistor, in which case the first terminal T1 is a base terminal, the second terminal T2 is a collector terminal, and the third terminal T3 is an emitter terminal. The terminals T1-3T are not specifically labeled in the bias arrangement 300 or in the rest of the drawings in order to not clutter these drawings.

As shown in FIG. 3, in this example, the bias circuit 210 may include a first transistor 312 and a second transistor 314, which may be referred to as first and second "bias circuit transistors," arranged in a cascode arrangement. As known in the art, "cascode arrangement" of a first transistor and a second transistor means that the third terminal of the second transistor is coupled to the second terminal of the first transistor. In this case, this means that the third terminal (i.e., the source terminal for the FET implementation of the transistor 314, shown in FIG. 3) of the second transistor 314 may be coupled to the second terminal (i.e., the drain terminal for the FET implementation of the transistor 312, shown in FIG. 3) of the first transistor 312. The first transistor 312 may be used to mirror the bias signal 202 to the output of the bias circuit, which is the first terminal of the first transistor 312 (i.e., the gate terminal for the FET implementation of the transistor 312, shown in FIG. 3). This is also indicated in FIG. 3 by illustrating that the output signal 211 is at the first terminal of the first transistor 312. The second transistor 314 may be omitted in some embodiments of the bias arrangement 300, in which case the second terminal of the transistor 312 would be coupled to the bias signal 202, and, eventually, to the supply voltage (for the N-type transistor implementation shown in FIG. 3), e.g., to Vdd (for the FET implementation shown in FIG. 3). However, the embodiments where the second transistor 314 is used may be advantageous in that the bias circuit 210 having at least 2 transistors in a cascode arrangement may provide better mirroring accuracy in mirroring the bias signal 202 to the output of the bias circuit 210. When the second transistor 314 is used, the second terminal of the second transistor 314 may be coupled to the bias signal 202, and further to the supply voltage (for the N-type transistor implementation shown in FIG. 3), e.g., to Vdd (for the FET implementation shown in FIG. 3), while the first terminal may be coupled to a reference voltage Vcas1, which may be a fixed DC voltage. In some embodiments, the reference voltage Vcas1 may be substantially the same voltage used to bias the cascode in the main power amplifier (the amplifier not shown in arrangement 200). The third terminal of the first transistor 312 may be coupled to the ground potential, denoted in the present drawings as Vgnd, for the N-type transistor implementation shown in FIG. 3.

As in FIG. 2B, the output signal 211, provided at the first terminal of the transistor 312, may be provided from the bias circuit 210 to the linearizer coupling circuit 230. The example shown in FIG. 3 illustrates the linearizer coupling circuit 230 as a circuit that includes a transistor 332, which may be referred to as a "coupling transistor." The output 211 of the bias circuit 210 may be provided as an input to the linearizer coupling circuit 230 by being applied to the third terminal of the coupling transistor 332. For the N-type transistor implementation shown in FIG. 3, the third terminal of the coupling transistor 332 may further be coupled to the ground potential Vgnd, e.g., via a resistor 336, while the second terminal of the coupling transistor 332 may be coupled to the supply voltage (e.g., Vdd). The first terminal of the coupling transistor 332 may be the terminal at which the output 231 of the linearizer coupling circuit 230 is provided. The output 231 of the linearizer coupling circuit 230 may then be coupled to the input of the bias circuit 210, thus forming the feedback path 240, as described with reference to FIG. 2B. The example of FIG. 3 specifically illustrates a further component 342, e.g., a voltage level shifter, which may be included in the feedback path 240 in some embodiments (in other embodiments, the feedback path 240 may not include any intermediate components and the first terminal of the coupling transistor 332 may be connected to the input of the bias circuit 210 directly). FIG. 3 illustrates a node 338, which can be seen as a node where the first terminals of the coupling transistor 332 and of the linearization transistors 322 are coupled together, and where each of these first terminals is coupled to the feedback path 240. In some embodiments, the node 338 may also be coupled to a capacitor 350, e.g., to a first capacitor electrode of the capacitor 350, where the second capacitor electrode of the capacitor 350 may be coupled to the ground potential (for the N-type transistor implementation of FIG. 3). In some embodiments, the capacitor 350 may be used to stabilize the bias loop 218.

Turning to the linearization circuit 220, the linearization circuit 220 shown in FIG. 3 is configured to provide an output for a differential amplifier as the output 221. As shown in FIG. 3, in such embodiments, the linearization circuit 220 may include two branches—one including a first linearization transistor 322-1 and coupled to a first output node 362-1, and another one including a second linearization transistor 322-2 and coupled to an output node 362-2. Together, the outputs 362-1 and 362-2 form the output 221 for providing a modified bias signal to a differential amplifier (the amplifier not specifically shown in FIG. 3, but such amplifier could be either PA1 or PA2, shown in FIG. 1). The signals provided at the output nodes 362-1 and 362-2 may be the same bias signals, except that the output node 362-1 may be coupled to a positive input of a differential amplifier, while the output node 362-2 may be coupled to a negative input of a differential amplifier, or vice versa.

For each of the two linearization transistors 322, the first terminal may be coupled to the first terminal of the coupling transistor 332, e.g., via the node 338, and may also be coupled to the bias signal 202, via the feedback path 240, as well as to the capacitor 350. Furthermore, for each of the two linearization transistors 322, for the N-type transistor implementation shown in FIG. 3, the second terminal may be coupled to the supply voltage Vs and the third terminal may be coupled to the ground potential Vgnd, e.g., via the resistor 326-1 for the linearization transistor 322-1 and via the resistor 326-2 for the linearization transistor 322-2. Resistors 326-1 and 326-2 set the bias current of the linearization transistors. In some embodiments, one or more of the resistors 326-1, 326-2, and 336 may be replaced by respective current sources (not shown in the present drawings). In some embodiments, the coupling transistor 332 may be substantially a replica of one of the linearization transistors 322, e.g., the coupling transistor 332 may have substantially the same dimensions and be formed of substantially the same materials as one of the linearization transistors 322. In other embodiments, the coupling transistor 332 may have dimensions of any multiple of one of the linearization transistors 322.

In some embodiments, resistors 364-1 and 364-2 may be used to sense the RF input of the amplifier (e.g., either PA1 or PA2, shown in FIG. 1) and couple the amplifier to the linearization transistors of the linearization circuit 220. Thus, the resistors 364-1 and 364-2 provide one example of the coupling circuit 250, more specifically, one example of a fixed implementation of the coupling circuit 250.

Figure 4:
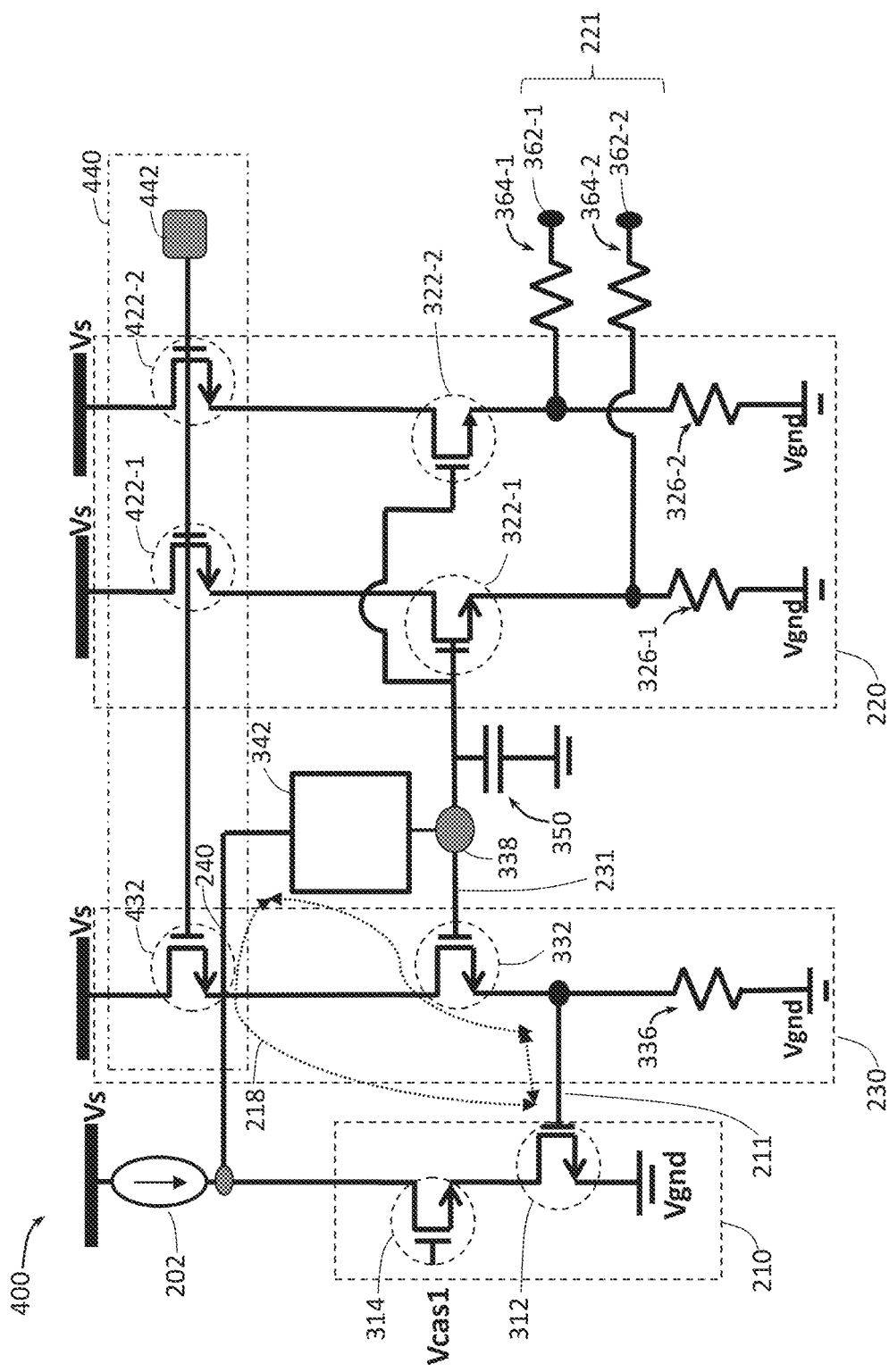

FIG. 4 provides a schematic illustration of an electric circuit diagram of a bias arrangement 400, which is the second example implementation of the bias arrangement 200, according to some embodiments of the present disclosure. The bias arrangement 400 is substantially the same as the bias arrangement 300, except that it further illustrates additional components enclosed within a dash-dotted contour 440. Therefore, in the interests of brevity, descriptions of the elements shown in FIG. 4 which were already provided with reference to FIG. 3 are not repeated, and only the differences between these drawings are described. The bias arrangement 400 illustrates that, in some embodiments, cascode transistors may be added to one or both the linearizer coupling circuit 230 and the linearization circuit 220. For example, in some embodiments, a second coupling transistor 432 may be coupled, in a cascode arrangement, to the coupling transistor 332. In this case, the second terminal of the coupling transistor 332 could be coupled to the supply voltage Vs via the second coupling transistor 432 by virtue of being coupled to the third terminal of the second coupling transistor 432 and the second terminal of the second coupling transistor 432 being then coupled to the supply voltage. Similarly, in some embodiments a second linearization transistor 422 (shown in FIG. 4 as a transistor 422-1 for the first branch of the linearization circuit 220, and shown as a transistor 422-2 for the second branch of the linearization circuit 220) may be coupled, in a cascode arrangement, to the respective linearization transistor 322. In this case, the second terminal of the linearization transistor 322-1 could be coupled to the supply voltage Vs via the second linearization transistor 422-1 by virtue of being coupled to the third terminal of the second linearization transistor 422-1 and the second terminal of the second linearization transistor 422-1 being then coupled to the supply voltage. Further, the second terminal of the linearization transistor 322-2 could be coupled to the supply voltage Vs via the second linearization transistor 422-2 by virtue of being coupled to the third terminal of the second linearization transistor 422-2 and the second terminal of the second linearization transistor 422-2 being then coupled to the supply voltage. The first terminals of each of the cascode transistors of the portion 440 may be coupled to a voltage source 442, which may provide a suitable voltage to, e.g., match the drain-source voltage (Vds) of the linearization transistors 322-1, 322-2 and/or of the transistors included in the amplifier to which the modified bias signal 221 is provided. Addition of the cascode transistors of the portion 440 shown in FIG. 4 may be particularly advantageous if the amplifier also includes such cascode transistors. Although FIG. 4 illustrates that cascode transistors are added to both of the linearizer coupling circuit 230 and the linearization circuit 220, in other embodiments of the bias arrangement 400, such cascode transistors may be added to one, but not both, of the linearizer coupling circuit 230 and the linearization circuit 220.

Figure 5:
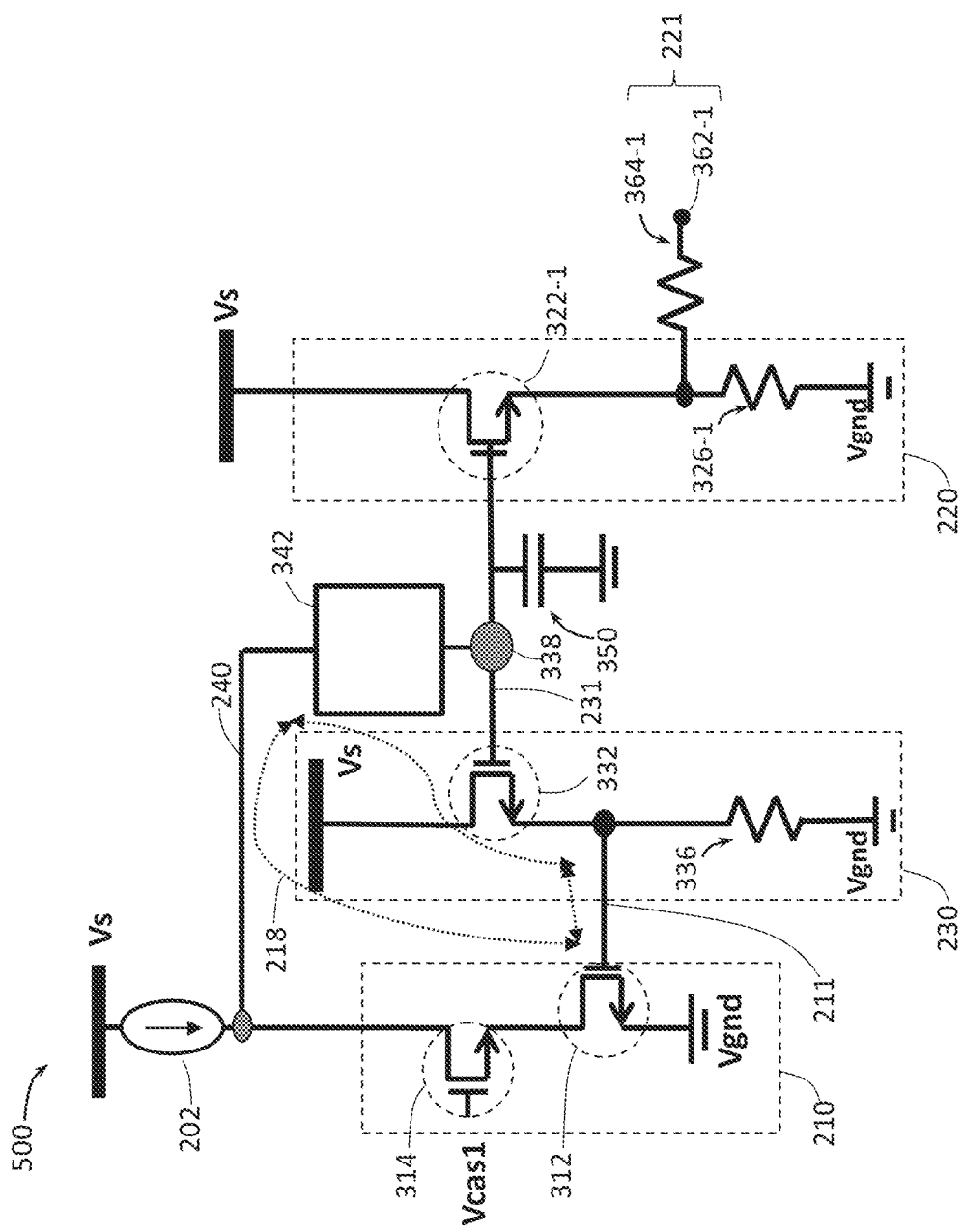

FIG. 5 provides a schematic illustration of an electric circuit diagram of a bias arrangement 500, which is the third example implementation of the bias arrangement 200, according to some embodiments of the present disclosure. The bias arrangement 500 is substantially the same as the bias arrangement 300 and, therefore, in the interests of brevity, descriptions of the elements shown in FIG. 5 which were already provided with reference to FIG. 3 are not repeated, and only the differences between these drawings are described. FIG. 5 differs from FIG. 3 in that, instead of having an output from the linearization circuit 220 for a differential amplifier as was shown in FIG. 3, the bias arrangement 500 has a single output branch. Therefore, one of the two branches of the linearization circuit 220 that were shown in FIG. 3 is not present in FIG. 5 (e.g., the second branch where the reference numerals of various elements had number 2 after the dash, e.g., the branch with the linearization transistor 322-2).

Figure 6:
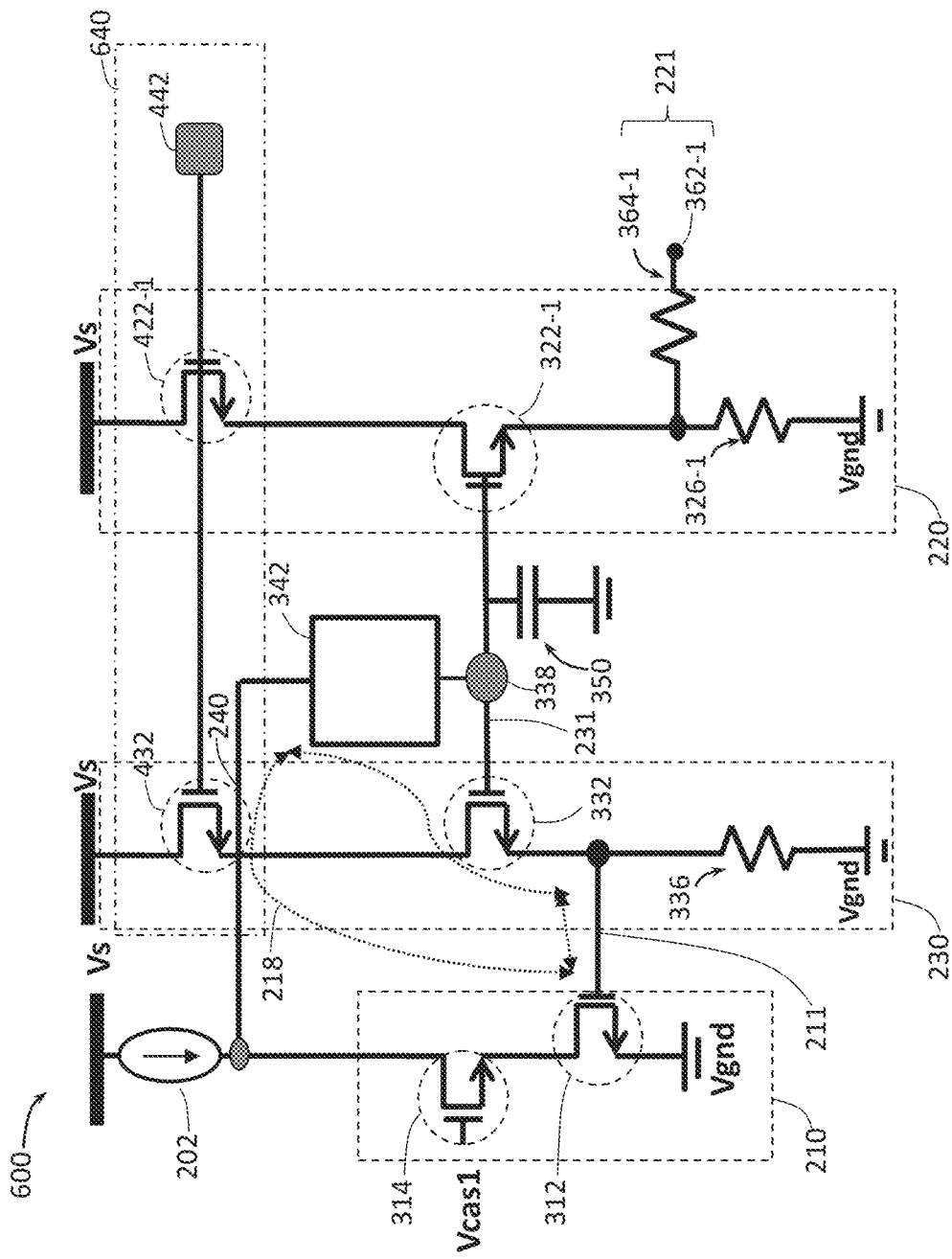

FIG. 6 provides a schematic illustration of an electric circuit diagram of a bias arrangement 600, which is the fourth example implementation of the bias arrangement 200, according to some embodiments of the present disclosure. The bias arrangement 600 is substantially the same as the bias arrangement 500, except that it further illustrates additional components enclosed within a dash-dotted contour 640. Therefore, in the interests of brevity, descriptions of the elements shown in FIG. 6 which were already provided with reference to FIG. 5 are not repeated, and only the differences between these drawings are described. Like the bias arrangement 400, the bias arrangement 600 illustrates that, in some embodiments, cascode transistors may be added to one or both the linearizer coupling circuit 230 and the linearization circuit 220. Such cascode transistors may be as those described with reference to FIG. 4, therefore, the same reference numerals are used in FIG. 6 as the ones used in FIG. 4. For example, in some embodiments, the second coupling transistor 432 may be coupled, in a cascode arrangement, to the coupling transistor 332, as described above. Similarly, in some embodiments, the second linearization transistor 422-1 may be coupled, in a cascode arrangement, to the linearization transistor 322-1, also as described above. Addition of the cascode transistors of the portion 640 shown in FIG. 6 may be particularly advantageous if the amplifier also includes such cascode transistors.

Each of FIGS. 3-6 illustrates embodiments where NMOS transistors are used to implement various transistors of the bias circuit 210, the linearization circuit 220, and the linearizer coupling circuit 230. In other embodiments of the bias arrangements shown in FIGS. 3-6, one or more of the NMOS transistors of any of the bias arrangements 300, 400, 500, and 600 may be replaced with N-type bipolar transistors, i.e., with NPN transistors. For such embodiments, descriptions provided above are still applicable, except that for such bipolar transistors, the "first terminals" described above are the base terminals (i.e., the terminals that were the gate terminals for the FETs described above), the "second terminals" are the collector terminals (i.e., the terminals that were the drain terminals for the FETs described above), and the "third terminals" are the emitter terminals (i.e., the terminals that were the source terminals for the FETs described above). Thus, in various embodiments of the bias arrangement 200, transistors used in the bias circuit 210, the linearization circuit 220, and the linearizer coupling circuit 230 may be NMOS transistors, NPN transistors, or a combination of NMOS and NPN transistors.

Figure 7:
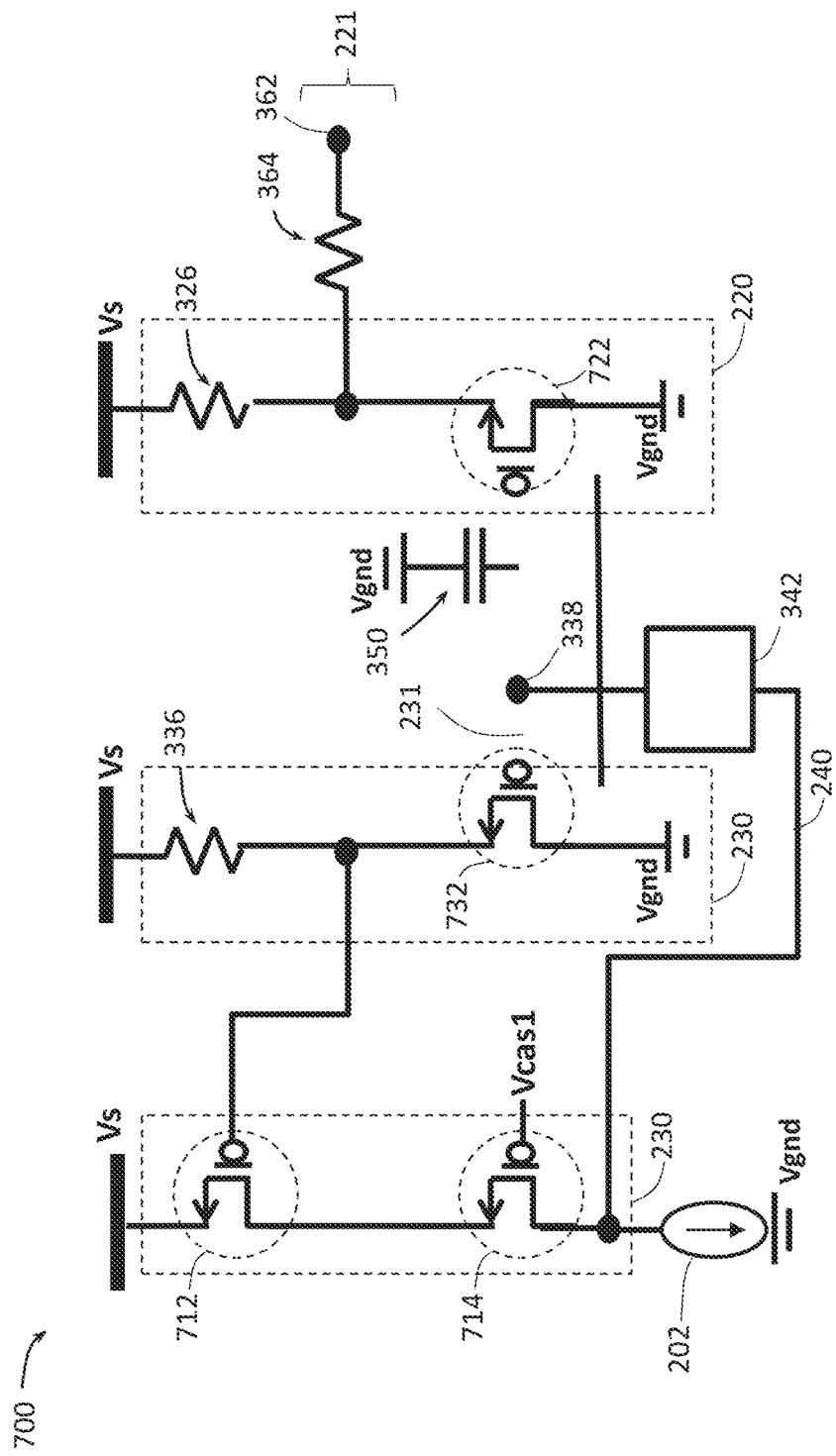

Furthermore, while each of FIGS. 3-6 illustrates, and the description above indicates, that the bias arrangement 200 may include various transistors of the N-type of transistors (e.g., NMOS or NPN transistors), in further embodiments, any of these transistors may be implemented as P-type transistors (e.g., PMOS or PNP transistors). For such embodiments, descriptions provided above are still applicable, except that for the P-type transistors, the supply voltage Vs described above for the N-type transistors is to be replaced with the ground potential Vgnd, and vice versa. An example of this is illustrated in FIG. 7, providing an electric circuit diagram of a bias arrangement 700, which is the fifth example implementation of the bias arrangement 200, according to some embodiments of the present disclosure. The bias arrangement 700 is substantially the same as the bias arrangement 500, except that all of the NMOS transistors shown in FIG. 5 are replaced with PMOS transistors in FIG. 7. Thus, transistors 712, 714, 722-1 and 732, shown in FIG. 7, are analogous to the transistors 312, 314, 322-1 and 332, shown in FIG. 5, except that the transistors of FIG. 7 are PMOS transistors. Similar modifications to FIGS. 3, 4, and 6 could be carried out in the same manner and, therefore, are not shown in the present drawings. Furthermore, in various embodiments of the bias arrangement 200, transistors used in the bias circuit 210, the linearization circuit 220, and the linearizer coupling circuit 230 may be P-type transistors other than PMOS transistors, e.g., PNP transistors. Thus, in various embodiments of the bias arrangement 200, transistors used in the bias circuit 210, the linearization circuit 220, and the linearizer coupling circuit 230 may be PMOS transistors, PNP transistors, or a combination of PMOS and PNP transistors. Still further, in various embodiments of the bias arrangement 200, transistors used in the bias circuit 210, the linearization circuit 220, and the linearizer coupling circuit 230 may be N-type transistors, P-type transistors, or a combination of N-type and P-type transistors.

Example Adaptive Coupling Circuits

Figure 8:
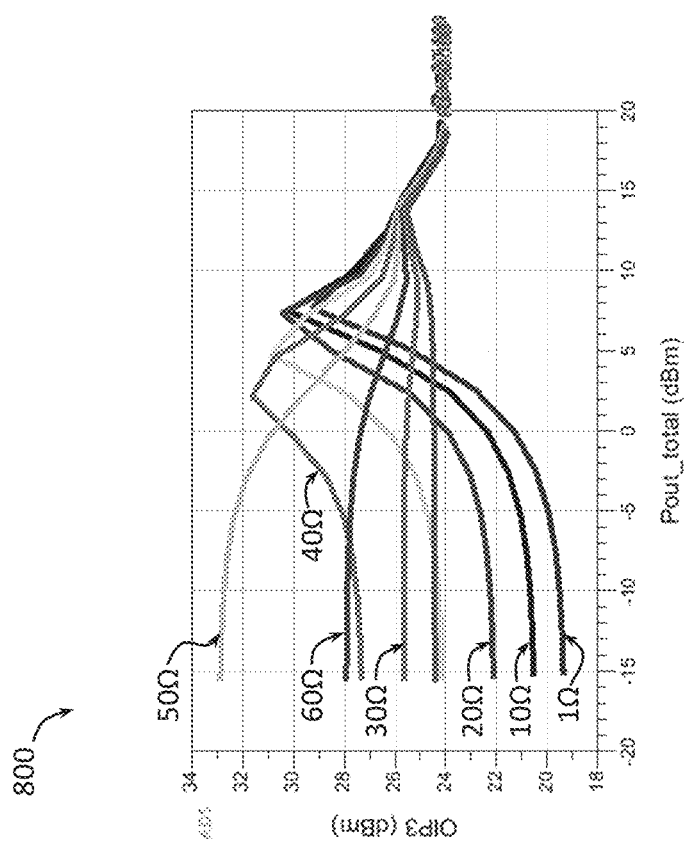
FIG. 8 provides a schematic illustration of how an output of a third-order intercept point (OIP3) may depend on an output power of an amplified RF signal generated by a PA for different resistance values of a resistor used to couple a bias circuit to the PA, according to some embodiments of the present disclosure.
Figure 9:
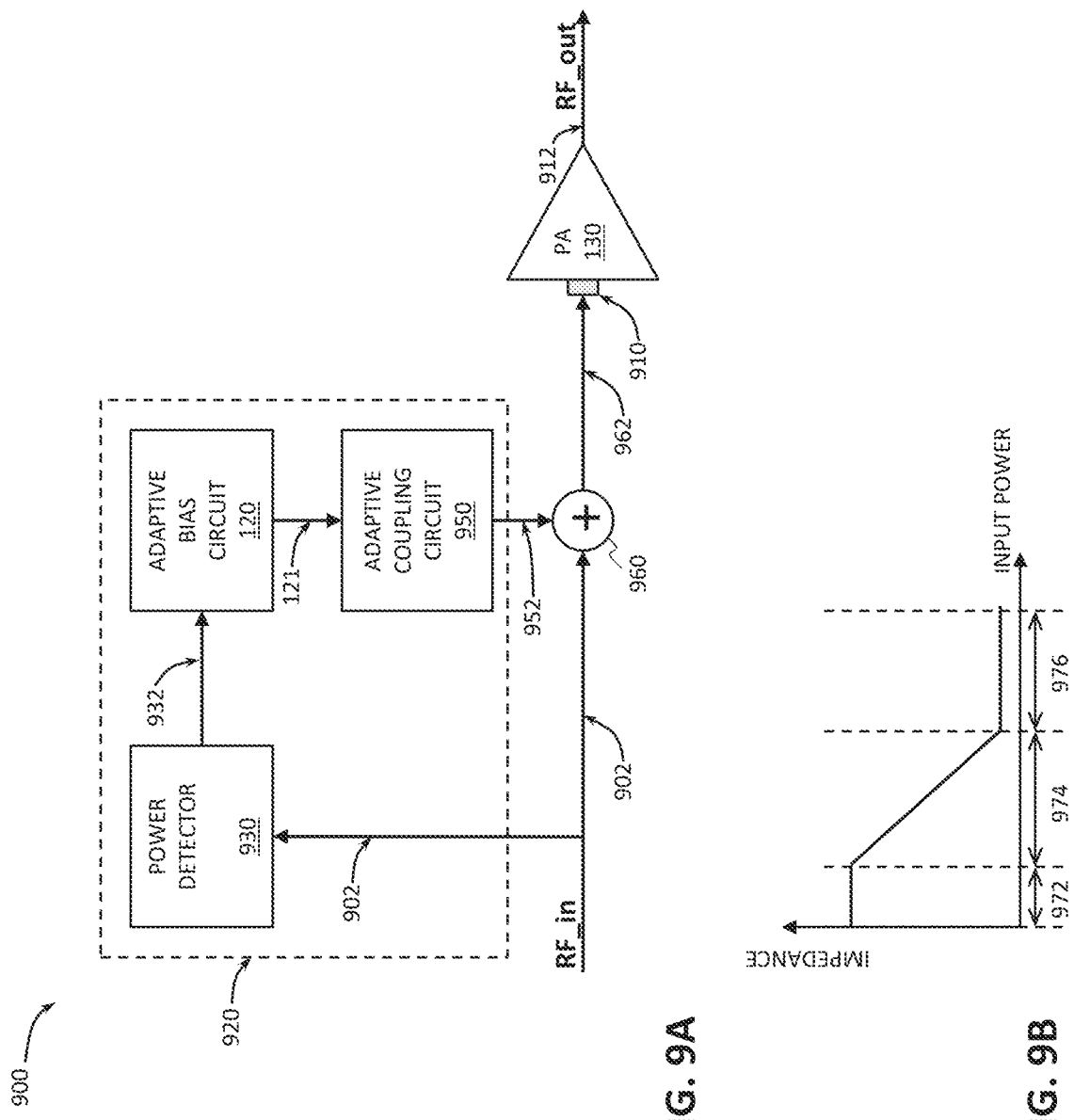
FIG. 9A provides a schematic illustration of a PA with a bias network that includes a bias circuit and an adaptive coupling circuit, according to some embodiments of the present disclosure.
FIG. 9B provides a schematic illustration of how a resistance of an adaptive coupling circuit may depend on an input power to a PA, according to some embodiments of the present disclosure.

Turning to the details of coupling the adaptive bias circuits 120 to the respective PAs as shown in FIG. 1, in some embodiments, an adaptive coupling circuit may be used to couple the adaptive bias circuit 120-1 to PA1 and/or to couple the adaptive bias circuit 120-2 to PA2. Such an adaptive coupling circuit may be the coupling circuit 250 shown in FIG. 2. FIGS. 8-9 provide illustrations that help explain concepts of adaptive coupling circuits that may be used in the segmented PA arrangement 100.

Bias circuits that provide bias signals for PAs contribute to linearity and efficiency of PAs. For example, adaptive bias circuits have been developed to optimize efficiency of power amplifiers. Such circuits are "adaptive" in that a bias signal provided to a PA is made dependent on a signal that is to be amplified by a PA, which may be advantageous in terms of improving efficiency of the PA. However, the bias circuit itself may inadvertently add nonlinearity to the bias signal, thereby degrading the linearity of the PA. In other words, one drawback of conventional adaptive bias circuits for PAs is that the PA linearity may degrade due to the bias circuit nonlinearity.

A common conventional approach to providing adaptive biasing to a PA while trying to preserve the linearity of the PA is to implement a bias network that uses a fixed coupling component, such as a fixed resistor, to couple an adaptive bias circuit to the PA. However, the inventor of the present disclosure realized that, in some deployment scenarios, using a fixed coupling component to couple an adaptive bias circuit to a PA may degrade power and/or efficiency of the PA. To that end, in some embodiments, an adaptive coupling circuit may be used for at least one of the adaptive bias circuits 120 of the segmented PA arrangement 100 to couple the adaptive bias signal 121 generated by the adaptive bias circuit 120 to the respective PA 130 (e.g., PA1 or PA2).

Such an adaptive coupling circuit may be configured so that an impedance of the coupling circuit is dependent on a power level of an input signal to be amplified by a given PA. As described above, the operation of the adaptive bias circuit may introduce some nonlinearity to the bias signal, which nonlinearity may distort the input signal to be amplified by the amplifier. The adaptive coupling circuit described herein may be configured to receive, at its' input, the bias signal generated by the adaptive bias circuit, e.g., to receive the bias signal 121 generated by the corresponding adaptive bias circuit 120. The adaptive coupling circuit is further configured to modify the received bias signal to generate a modified bias signal, where the modified bias signal is then provided to the respective amplifier, e.g., to PA1 or PA2 of the segmented PA arrangement 100. In particular, by configuring the coupling circuit to have a variable impedance that depends on the power level of the input signal to the respective amplifier, the coupling circuit may adapt to the input power level and, in that manner, may modify the bias signal to reduce or optimize at least some of the nonlinearity introduced to the bias signal by the adaptive bias circuit.

In this context, both the adaptive bias circuit and the adaptive coupling circuit that coupled the adaptive bias circuit to a respective amplifier may be seen as "modifying" a bias signal that is used to bias the amplifier, but the modifications provided by each of these two circuits are different. In particular, while the adaptive bias circuit may be configured to make sure that the bias signal is based on the power level at which the amplifier operates, the adaptive coupling circuit may be configured to reduce or eliminate from the bias signal generated by the bias circuit at least some nonlinear components that may be introduced to the bias signal by the bias circuit itself, which may optimize the bias signal in terms of the bias signal degrading the linear behavior of the amplifier. Some embodiments of the present disclosure are based on the realization that the nonlinearity of the adaptive bias signal may change according to the input power level (i.e., the power level of the signal to be amplified by the amplifier) and that the level of the nonlinearity in the adaptive bias signal may depend on the impedance between the adaptive bias circuit and the amplifier input. Therefore, providing a bias network for an amplifier where an adaptive coupling circuit may be configured to adapt the impedance between the amplifier input and the adaptive bias circuit according to the input power level may improve (e.g., optimize) the overall linearity of the amplifier.

The inventor of the present disclosure realized that, in some deployment scenarios, one or more of the power, noise performance, and maximum efficiency of a PA may degrade due to the use of a fixed coupling component, e.g., fixed resistors 364, shown in FIGS. 3-7, to couple the adaptive bias circuit 120 to the respective PA 130. This may be explained with reference to FIG. 8, providing a schematic illustration of how an OIP3 output may depend on an output power of an amplified RF signal (Pout_total) generated by a PA for different resistance values of a resistor used to couple the bias circuit to the PA, according to some embodiments of the present disclosure. Different curves shown in FIG. 8 are associated with different values of a resistor that may couple a bias circuit to a PA, e.g., the fixed resistors 364, shown in FIGS. 3-7, where resistance values are used to label the different curves. As shown in FIG. 8 for resistance values between 1 and 50 Ohm (Ω), at first, the OIP3 output may advantageously increase as the resistance increases, meaning that increasing the value of the fixed coupling resistor may provide advantages in terms of improving linearity of the output power of the PA. However, increasing the value of the resistance further may, at some point, result in decreasing the OIP3 output, as is shown in FIG. 8 with a resistance value of 60Ω, for which the OIP3 output is lower than for a 50Ω resistance. In circuits with different configurations and at different powers of the input signals, the threshold value at which increasing the resistance further becomes counter-productive, may be different. Thus, the inventor of the present disclosure realized that, for a given circuit architecture and a given input power of a signal to be amplified by a given PA, there may be some optimum value, or a range of values, of a resistance (or, more generally, an impedance) of a coupling circuit used to couple the output of a bias circuit to an input of the PA. Therefore, being able to adaptively vary this value may be desirable in terms of achieving an improved balance between power, efficiency, and linearity of a PA. Said realization forms the basis for various bias networks with adaptive coupling circuits, described in greater detail below.

FIG. 9A provides a schematic illustration of an RF transmitter 900 that includes the PA 130, as described above, with a bias network 920 that includes the adaptive bias circuit 120 and an adaptive coupling circuit 950, according to some embodiments of the present disclosure. In some embodiments, the RF transmitter 900 may be used to implement a portion 105-1 (outlined in FIG. 1 with a dash-dotted contour) of the segmented PA arrangement 100. In some embodiments, the RF transmitter 900 may be used to implement a portion 105-2 (outlined in FIG. 1 with a dash-dotted contour) of the segmented PA arrangement 100. The PA 130 included in the RF transmitter 900 may be configured to amplify the input signal (RF_in) 902, which may be e.g., the signal 105 or the signal 111 as described herein, to generate an PA output signal (RF_out) 912, which may be the PA output signal 141 as described herein.

In some embodiments, the bias network 900 may include a power detector 930, configured to receive the PA input signal 902 and provide a signal 932 to the adaptive bias circuit 120, the signal 932 configured to indicate to the adaptive bias circuit 120 the level of the power of the PA input signal 902, as detected by the power detector 930. In some embodiments, the power detector 930 may be a part of the adaptive bias circuit 120. In various embodiments, any power detector as used in the art may be used as the power detector 930, such as a peak detector, an envelope detector, a resistor, or even just a short circuit.

The adaptive coupling circuit 950 may be a circuit used for coupling an output of the adaptive bias circuit 120 and an input of the PA 130 in a way that the bias signal 121 generated by the adaptive bias circuit 120 may be modified, by the adaptive coupling circuit 950, to produce a modified bias signal 952 that may be based not only on the bias signal 121 but also on the input power of the signal 902 to be amplified by the PA 130. To that end, the adaptive coupling circuit 950 may be configured to be such that the impedance (e.g., the resistance) of the adaptive coupling circuit 950 may vary depending on the power of the PA input signal 902. In some embodiments, the variation may be as schematically illustrated with a curve shown in FIG. 9B, indicating that, in some embodiments, the impedance of the adaptive coupling circuit 950 may be the largest for some value or a first range 972 of values of the input power (i.e., the power of the PA input signal 902), then gradually decrease for a second range 974 of values of the input power, and, finally, be the smallest for some value or a third range 976 of values of the input power. While FIG. 9B illustrates a linear decrease of the impedance in the second range 974, in various embodiments, the impedance in the second range 974 may decrease according to some other function other than what is shown in FIG. 9B. Configuring the adaptive coupling circuit 950 to adaptively vary its' impedance based on the power of the PA input signal 902 may enable realizing an improved balance between power, efficiency, and linearity of the PA 130.

The adaptive coupling circuit 950 may be seen as a circuit providing a variable level of isolation (e.g., adaptive isolation) between the adaptive bias circuit 120 and the PA 130, where the isolation depends on the power of the PA input signal 902. Phrased differently, the adaptive coupling circuit 950 may be seen as a circuit providing a variable level of coupling strength (e.g., adaptive coupling) between the adaptive bias circuit 120 and the PA 130, where the coupling strength depends on the power of the PA input signal 902. The coupling strength may be proportional to the inverse of the isolation—the greater the isolation, the smaller the coupling strength, and vice versa.

At relatively low input powers (e.g., in the first range 972), the adaptive coupling circuit 950 may provide a finite optimal isolation between the adaptive bias circuit 120 and the PA 130 where the isolation may control (e.g., reduce or limit) the nonlinearity that may be added by the adaptive bias circuit 120. At such input powers, the adaptive coupling circuit 950 may be configured to function as a pre-distortion circuit that may be configured to reduce or cancel the nonlinearity of the PA 130 at back-off power levels. To that end, at low input powers, the adaptive coupling circuit 950 may be configured to provide a relatively high isolation which means the impedance of the adaptive coupling circuit 950 may be relatively high, as illustrated in FIG. 9B. For example, in some embodiments, at relatively low input power levels, the adaptive coupling circuit 950 may be configured to have a resistance between about 90Ω and 110Ω, including all values and ranges therein.

On the other hand, at relatively high input powers (e.g., in the third range 976), the adaptive coupling circuit 950 may be configured to provide minimum or even no isolation between the adaptive bias circuit 120 and the PA 130, which may advantageously allow increasing the output power and efficiency of the PA 130. In some embodiments, at such high input powers, e.g., near a 1 decibel (dB) compression point (P1dB) power level, the adaptive coupling circuit 950 may be configured to act as a short circuit (where the P1dB may refer to the output power level at which the gain of the PA 130 may decrease 1 dB from its constant value). This means that, at relatively high input powers, the impedance of the adaptive coupling circuit 950 may be relatively low, as also illustrated in FIG. 9B. For example, in some embodiments, at relatively high input power levels, the adaptive coupling circuit 950 may be configured to have a resistance between about 1Ω and 30Ω, including all values and ranges therein.

The adaptive coupling circuit 950 may modify the bias signal 121 generated by the adaptive bias circuit 120 to generate the modified bias signal 952 that signal is based on the bias signal 121 and further based on a power level of the PA input signal 902. The modified bias signal 952 may then be combined with the PA input signal 902, as is schematically illustrated in FIG. 9 with a combiner 960 performing said combination, to produce a combined signal 962 that includes the PA input signal 902 and the modified bias signal 952 (this is also applicable to the bias signal 121 and the RF input signal 111 illustrated as inputs to each PA 130 in FIG. 1, even though FIG. 1 does not specifically illustrate a combiner but shows that the signals 121 and 111 are provided to the PA 130 separately). The PA 130 is then configured to amplify the combined signal 962 to generate an amplified PA output signal 912 (RF_out). Although combination of the PA input signal 902 and the modified bias signal 952 is shown in FIG. 9A to be performed outside of the PA 130, in some embodiments, said combination may be performed within the PA 130, which is one of the reasons why a combiner such as the combiner 960 is not shown in the illustration of FIG. 1 and why FIG. 1 shows that the signals 121 and 111 are provided to the PA 130 separately. In other words, in some embodiments, instead of the PA 130 receiving a single combined signal 962 as shown in FIG. 9A, the PA 130 may be configured to receive the PA input signal 902 and the modified bias signal 952 separately and combine them as a part of performing the amplification of the PA input signal 902 to generate the amplified PA output signal 912. Thus, in general, in various embodiments, the PA input signal 902 and the modified bias signal 952 may be provided to an input 910 of the PA 130, either together as the combined signal 962, or as separate signals.

Implementing the adaptive coupling circuit 950 as described herein may improve P1dB and the linearity of the PA 130, e.g., by realizing an adaptive isolator between the adaptive bias circuit 120 and the PA 130 that may control the isolation value based on the input power range. In some embodiments, the isolation level of the adaptive coupling circuit 950 may be high at relatively low input power levels to isolate the nonlinearity of the adaptive bias circuit 120 and improve the back-off OIP3 of the PA 130. In some embodiments, the isolation level of the adaptive coupling circuit 950 may decrease at higher input powers to, e.g., enable bias ramping and improve the P1dB, high power linearity, and efficiency of the PA 130.

There are many different approaches to how the adaptive coupling circuit 950 may be implemented to function in accordance with the principles described herein, all of which being within the scope of the present disclosure. For example, in some embodiments, the adaptive coupling circuit 950 may be implemented as an adaptive resistor configured so that the resistance value of the resistor depends on the power level of the PA input signal 902 as described herein. For example, in some embodiments, the resistance of such an adaptive resistor may be about 100Ω at relatively low input power levels, e.g., to isolate the nonlinear distortion that may be introduced by the adaptive bias circuit 120 from the input of the PA 130, e.g., in order to reduce, minimize, or avoid affecting the PA back-off OIP3 of the PA 130. Furthermore, in some embodiments, the resistance of such an adaptive resistor may be about, e.g., 2Ω at relatively high input power levels, e.g., to improve the P1dB, high power linearity and efficiency of the PA 130.

Example Optimizations of Segmented PA Arrangements

Further details of implementing the segmented PA arrangement according to various embodiments will now be explained with reference to FIG. 10, providing a schematic illustration of an example segmented PA arrangement 1000 with feedforward adaptive bias circuits, according to some embodiments of the present disclosure. The segmented PA arrangement 1000 is an example of the segmented PA arrangement 100 of FIG. 1 and, therefore, some elements of the segmented PA arrangement 1000 are illustrated with the reference numerals used in FIG. 1 to indicate analogous or functionally similar elements as those of the segmented PA arrangement 100, so that, in the interests of brevity, explanations provided with respect to one of FIG. 1 and FIG. 10 are not repeated for the other.

Figure 10:
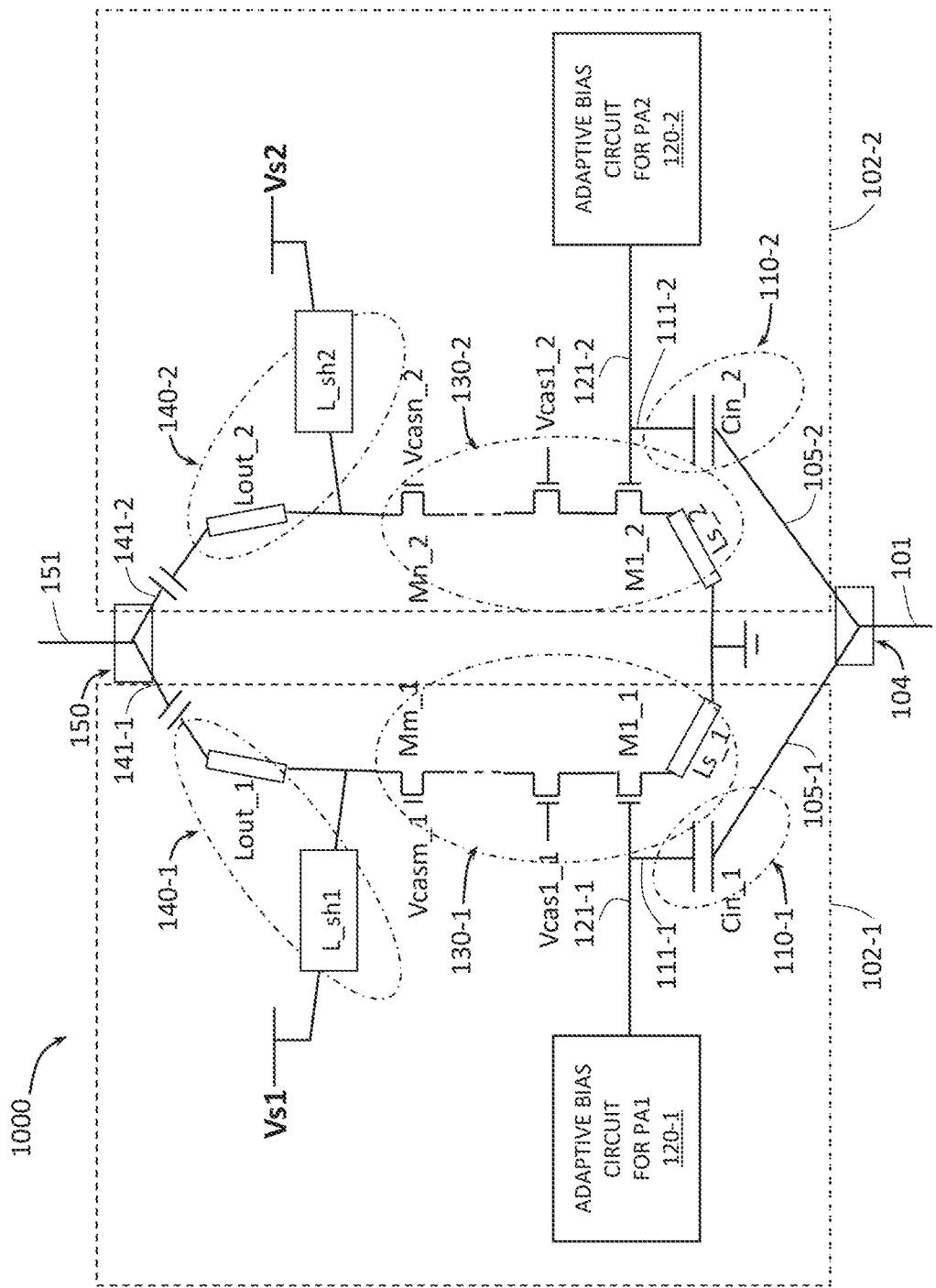
FIG. 10 provides a schematic illustration of an example segmented PA arrangement with feedforward adaptive bias circuits, according to some embodiments of the present disclosure.

In FIG. 10, various transistors are shown within their conventional electric circuit diagram notations, e.g., as was explained with reference to FIG. 3. While transistors shown in FIG. 10 are NMOS transistors, in other embodiments of the segmented PA arrangement 1000, any of these transistors may be replaced with NPN transistors, and/or all N-type transistors of the segmented PA arrangement 1000 may be replaced with P-type transistors with further circuit modifications that would be apparent to a person of ordinary skill in the art (e.g., as was described above with reference to FIGS. 3-6).

As was described above, each of the adaptive bias circuits 120 is a feedforward circuit in that it is configured to generate a bias signal that adapts to the input power level of the respective PA segment 102, and is placed at the input to the PA segment 102. In some embodiments, other components of the segmented PA arrangement 100 may cooperate with the adaptive bias circuits 120 to help control when each of the PAs 130 is turned on/off and how they operate to achieve improvements in the combined output signal 151 in terms of linearity, die area, sensitivity, bandwidth, and back-off efficiency.

For the following description of FIG. 10, consider an example where the first segment 102-1 is the one where the PA (i.e., PA1) is configured to turn on first, even when the input signal 101 has a relatively low input power. The second segment 102-2 is the one where the PA (i.e., PA2) is configured to turn on later, depending on the input power. Importantly, PA2 is configured to turn on not only on the input power but also on its coupling and adaptive circuits optimization.

Figure 11:
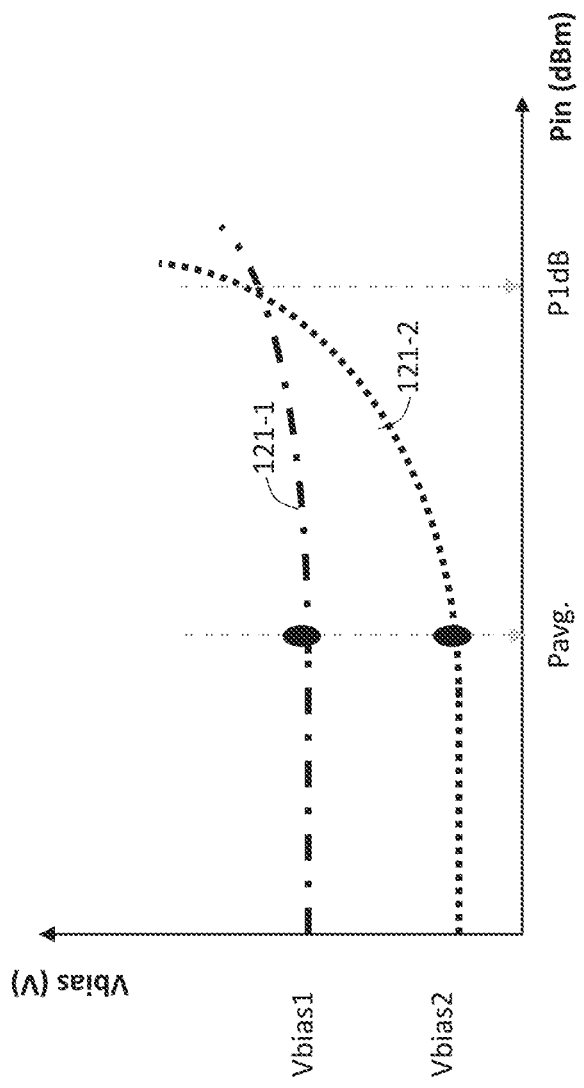
FIG. 11 provides example illustrations of a bias signal amplitude as a function of an input power for the first and second segments of the segmented PA arrangements as shown in FIG. 1 and/or FIG. 10, according to some embodiments of the present disclosure.

FIG. 11 provides example illustrations of a bias signal amplitude (depicted along the vertical axis) as a function of an input power (depicted along the horizontal axis) for the first and second segments of the segmented PA arrangements 100 and/or 1000, according to some embodiments of the present disclosure. In particular, in FIG. 11, the dash-dotted line illustrates an amplitude of the bias signal as a function of an input power Pin for the first PA segment 102-1 (e.g., illustrating an example for the first bias signal 121-1), while the dotted line illustrates an amplitude of the bias signal as a function of an input power Pin for the second PA segment 102-2 (e.g., illustrating an example for the second bias signal 121-2). As used herein, amplitude of a bias signal that includes a DC component, at least one RF component, and at least one harmonic of the RF component may be proportional (e.g., substantially equal) to a square root of a sum of the squared value of the DC component and the squared values of each of the RF components (e.g., of the at least one RF component and at least one harmonic of the RF component).

As shown in FIG. 11, in some embodiments, the adaptive bias circuit 120-1 may be configured to generate the bias signal 121-1 that is dependent on the power of the input signal 101 in that an amplitude of the bias signal 121-1 may be at a constant first value, Vbias1, when the power of the input signal is equal to or smaller than a first threshold power, and increases at a first rate when the power of the input signal is greater than the first threshold power, while the adaptive bias circuit 120-2 may be configured to generate the bias signal 121-2 that is dependent on the power of the input signal in that an amplitude of the bias signal 121-2 is at a constant second value, Vbias2, when the power of the input signal is equal to or smaller than a second threshold power, and increases at a second rate when the power of the input signal is greater than the second threshold power, where the value of Vbias1 is greater than the value of Vbias2, and where the rate at which the bias signal 121-2 increases after its' threshold is higher than the rate at which the bias signal 121-1 increases after its' threshold. The difference in rates of increase is seen in FIG. 11 with the bias signal 121-2 having a higher slope than the bias signal 121-1 for powers greater than a certain power labeled in FIG. 11 as Pavg. Thus, Pavg may be considered to be the threshold for each of the first and second bias signals 121 in this example (i.e., the first threshold may be substantially equal to the second threshold), although in other embodiments, the first and second thresholds may be different. In fact, the threshold after which the first bias signal 121-1 starts to increase from the value Vbias1 is shown in FIG. 11 to be at a power higher than Pavg. Because of this relation of the bias signals 121-1 and 121-2 with respect to one another, the first bias signal 121-1 may be referred to as a "high DC and low slope" bias signal while the second bias signal 121-2 may be referred to as a "low DC and higher slope" bias signal.

FIG. 11 also illustrates the P1dB compression point. In some embodiments, the second bias signal 121-2 may reach and cross the first bias signal 121-1 at about the P1dB compression point, as shown in FIG. 11, although, in other embodiments, the value of where the bias signals 121 cross and the value of the P1dB compression point may be different.

Figure 12:
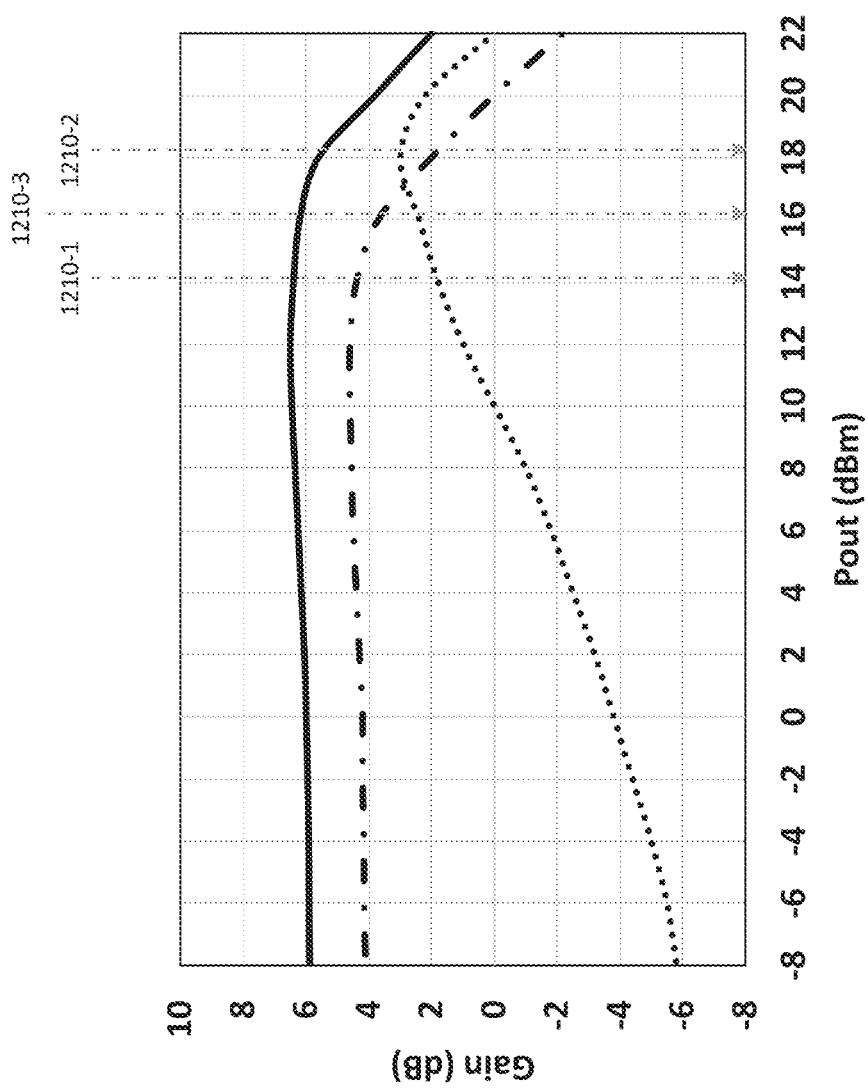
FIG. 12 provides example illustrations of a gain as a function of an output power for the first and second segments of the segmented PA arrangements as shown in FIG. 1 and/or FIG. 10, according to some embodiments of the present disclosure.

Configuring the first adaptive bias circuit 120-1 to generate a high DC and low slope bias signal 121-1 may allow providing a relatively flat gain, i.e., relatively low gain expansion, of the first PA segment 102-1 (or of the PA1) at lower output powers, and configuring the second adaptive bias circuit 120-2 to generate a low DC and higher slope bias signal 121-2 may allow providing a relatively high gain expansion of the second PA segment 102-2 (or of the PA2) at higher output powers. This can be seen in FIG. 12, providing example illustrations of a gain (depicted along the vertical axis) as a function of an output power (depicted along the horizontal axis) for PA output signals that may be generated by the PAs of the segmented PA arrangements 100 and/or 1000, according to some embodiments of the present disclosure. In FIG. 12, the dash-dotted line illustrates the gain as a function of the output power Pout for the first PA segment 102-1 (e.g., illustrating an example for the first PA output signal 131-1), the dotted line illustrates the gain as a function of the output power Pout for the second PA segment 102-2 (e.g., illustrating an example for the second PA output signal 131-2), while the solid line illustrates the gain as a function of the output power Pout for the combined output signal from the segmented PA arrangement 100 and/or 1000 (e.g., illustrating an example for the combined output signal 151). As is shown in FIG. 12, at lower values of Pout, the gain of the first PA segment 102-1 is relatively flat, meaning that the gain expansion of the first PA segment 102-1 is relatively low. In this region, the gain of the first PA segment 102-1 is also relatively high, compared to the gain of the second PA segment 102-2. As further shown in FIG. 12, as Pout increases, the gain of the second PA segment 102-2 increases quickly, meaning that the gain expansion of the second PA segment 102-2 is relatively high. As can also be seen in FIG. 12, after a certain value of Pout, the gain of the first PA segment 102-1 starts to decrease, i.e., gain compression takes place (after about 14 dB for the illustration of FIG. 12, indicated with a value 1210-1). Gain compression also starts for the second PA segment 102-2, although after a higher Pout (after about 18 dB for the illustration of FIG. 12, indicated with a value 1210-2). As a result of combining the outputs of the first and second PA segments 102, the gain compression point of the combined output signal 151 may, advantageously, be pushed to a higher Pout value (after about 16 dB for the illustration of FIG. 12, indicated with a value 1210-3). Thus, the bias signals 121 may be configured so that the gain expansion of the second PA output signal 131-2 compensates the gain compression of the first PA output signal 131-1, such that the compression point of the combined output signal 151 is increased after the combiner 150 combined the first PA output signal 131-1 and the second PA output signal 131-2.

Overall for the combined output signal 151, as can be seen in FIG. 12, the first adaptive bias circuit 120-1 may be configured to adapt the first bias signal 121-1 in combination with the second adaptive bias circuit 120-2 adapting the second bias signal 121-2 to provide a substantially constant gain (or, equivalently, a low gain expansion) of the combined output signal 151 for output powers of the combined output signal 151 below a third value (i.e., the gain compression point for the combined output signal 151, indicated with the value 1210-3 in FIG. 12), and a gain compression of the combined output signal 151 for output powers of the combined output signal above the third value, where the third value is greater than the first value (i.e., the gain compression point for the first PA output signal 131-1, indicated with the value 1210-1 in FIG. 12) and smaller than the second value (i.e., the gain compression point for the second PA output signal 131-2, indicated with the value 1210-2 in FIG. 12). The overall gain is also increased for the combined output signal 151. In particular, as can be seen in FIG. 12, the gain of the combined output signal 151 for output powers below the third value 1210-3 is greater than the gain of the first PA output signal 131-1 for output powers below the first value 1210-1, and the gain of the first PA output signal 131-1 for output powers below the first value 1210-1 is greater than the gain of the second PA output signal 131-2 for output powers below the second value 1210-2.

Figure 13:
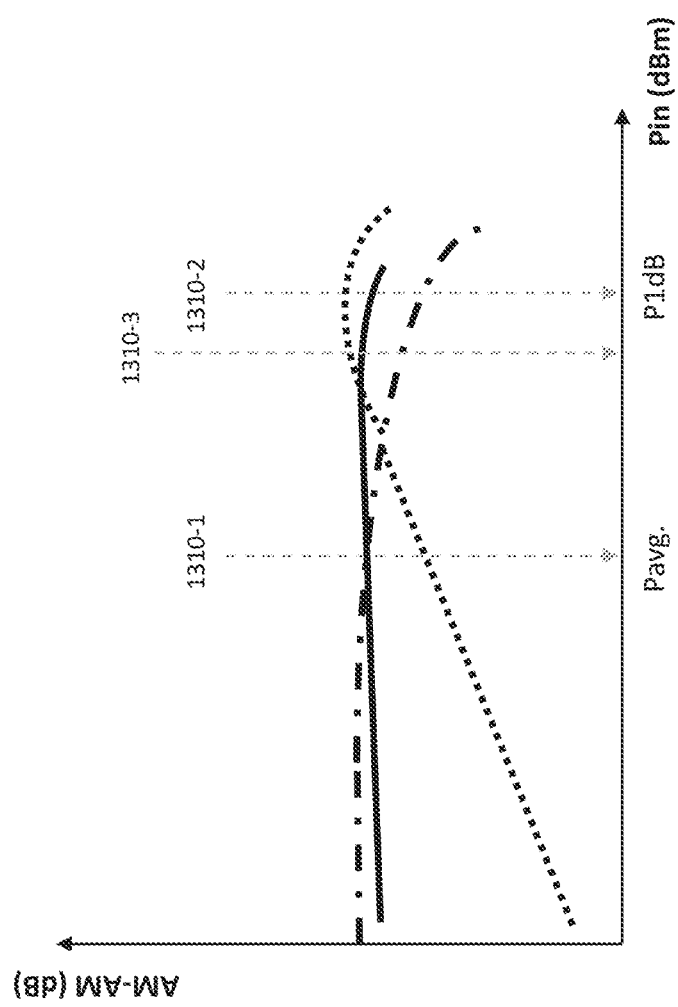
FIG. 13 provides example illustrations of a normalized gain as a function of an input power for the first and second segments of the segmented PA arrangements as shown in FIG. 1 and/or FIG. 10, according to some embodiments of the present disclosure.

Similar to FIG. 12, FIG. 13 also provides an illustration of a gain as a function of a signal power, but, in contrast to FIG. 12, FIG. 13 provides example illustrations of a normalized gain (depicted along the vertical axis) as a function of an input power (depicted along the horizontal axis) for PA output signals that may be generated by the PAs of the segmented PA arrangements 100 and/or 1000, according to some embodiments of the present disclosure. As is indicated in FIG. 13, the normalized gain may be defined in terms of AM-AM ratio, measured in dB, referring to a ratio of the amplitude of the output signal (hence, "AM" where "A" stands for "amplitude" and "M" stands for "modulation") to the amplitude of the input signal. In FIG. 13, the dash-dotted line illustrates the normalized gain as a function of the input power Pin for the first PA segment 102-1 (e.g., illustrating an example for the first PA output signal 131-1), the dotted line illustrates the normalized gain as a function of the input power Pin for the second PA segment 102-2 (e.g., illustrating an example for the second PA output signal 131-2), while the solid line illustrates the normalized gain as a function of the input power Pin for the combined output signal from the segmented PA arrangement 100 and/or 1000 (e.g., illustrating an example for the combined output signal 151). As is shown in FIG. 13, at lower values of Pin (e.g., for the values of Pin lower than about the value 1310-1, Pavg, labeled in FIG. 13), the normalized gain of the first PA segment 102-1 is relatively flat, meaning that the gain expansion of the first PA segment 102-1 is relatively low. In this region, the normalized gain of the first PA segment 102-1 is also relatively high, compared to the normalized gain of the second PA segment 102-2. As further shown in FIG. 13, as Pin increases, the normalized gain of the second PA segment 102-2 increases quickly, meaning that the gain expansion of the second PA segment 102-2 is relatively high. As can also be seen in FIG. 13, after a certain value of Pin (e.g., after the value 1310-1), the normalized gain of the first PA segment 102-1 starts to decrease, i.e., gain compression takes place. Gain compression also starts for the second PA segment 102-2, although after a higher Pin, which value is shown in FIG. 13 as a value 1310-2. As a result of combining the outputs of the first and second PA segments 102, the gain compression point of the combined output signal 151 may, advantageously, be pushed to a higher Pin value, which value is shown in FIG. 13 as a value 1310-3, which may be in between the values 1310-1 and 1310-2. Thus, the bias signals 121 may be configured so that the gain expansion of the second PA output signal 131-2 compensates the gain compression of the first PA output signal 131-1, such that the compression point of the combined output signal 151 is increased after the combiner 150 combined the first PA output signal 131-1 and the second PA output signal 131-2. FIG. 13 also illustrates the P1dB compression point. In some embodiments, the value 1310-2 may be substantially equal to the P1dB compression point, although in other embodiments, these values may be different.

In some embodiments, coupling between the adaptive bias circuits 120 and inputs of the respective PAs 130 may help ensuring that the bias signal 121-1 is a high DC and low slope bias signal and that the bias signal 121-2 is a low DC and higher slope bias signal. For example, in some embodiments, the first PA segment 102-1 may include a first resistor, configured to couple the first bias signal 121-1 to PA1 (e.g., to the input of the first PA 130-1), while the second PA segment 102-2 may further include a second resistor, configured to couple the second bias signal 121-2 to PA2 (e.g., to the input of the second PA 130-2). In such embodiments, implementing the first resistor with a resistance that is larger than a resistance of the second resistor ensures that the coupling strength of the first resistor is smaller than a coupling strength of the second resistor, which leads to a low slope of the bias signal vs. input power for the PA1 and a high slope of the bias signal vs. input power for the PA2. In some embodiments, each of such first and second resistors may be implemented as, e.g., one or both of the resistors 364, described with reference to FIGS. 3-7. In other embodiments, other coupling circuits may be used to couple the bias signals 121 to their respective PAs 130 in a way that ensures such differences in the coupling strengths. Therefore, more generally, the first PA segment 102-1 may include a first coupling circuit, configured to couple the first bias signal 121-1 to PA1 (e.g., to the input of the first PA 130-1), while the second PA segment 102-2 may further include a second coupling circuit, configured to couple the second bias signal 121-2 to PA2 (e.g., to the input of the second PA 130-2) 121-1 to PA1 (e.g., to the input of the first PA 130-1), such that the coupling strength of the first coupling circuit is smaller than a coupling strength of the second coupling circuit, which leads to a low slope of the bias signal vs. input power for the PA1 and a high slope of the bias signal vs. input power for the PA2.

In some embodiments, coupling between the adaptive bias circuits 120 and inputs of the respective PAs 130 may help ensuring that the bias signal 121-1 is a high DC and low slope bias signal and that the bias signal 121-2 is a low DC and higher slope bias signal, while also providing adaptive isolation as, e.g., was described with reference to FIGS. 8-9. For example, in some embodiments, the first PA segment 102-1 may include a first coupling circuit, configured to couple the first bias signal 121-1 to PA1 (e.g., to the input of the first PA 130-1), while the second PA segment 102-2 may further include a second coupling circuit, configured to couple the second bias signal 121-2 to PA2 (e.g., to the input of the second PA 130-2), such that one or both of these coupling circuits is configured so that an impedance of the coupling circuit is dependent on the input power to the respective PA. For example, one or both of these coupling circuits may be the adaptive coupling circuit 950, described above. In such embodiments, when the first coupling circuit is configured so that the impedance of the first coupling circuit is dependent on the power of the input signal to the PA1, the first coupling circuit may ensure that, when the input power to the PA1 is at a first power level, the impedance of the first coupling circuit is a first impedance, and, when the input power to the PA1 is at a second power level that is higher than first power level, the impedance of the first coupling circuit is a second impedance, lower than the first impedance. Similarly, when the second coupling circuit is configured so that the impedance of the second coupling circuit is dependent on the input power to the PA2, the second coupling circuit may ensure that, when the input power to the PA2 is at a third power level, the impedance of the second coupling circuit is a third impedance, and, when the input power to the PA2 is at a fourth power level that is higher than third power level, the impedance of the second coupling circuit is a fourth impedance, lower than the third impedance.

As the foregoing illustrates, the bias signals 121 provided to the respective PAs 130 may be dependent (i.e., adaptive) not only on the input power to the respective PAs 130, but also on the coupling circuit optimizations between the adaptive bias circuits 120 and the respective PAs 130. Thus, for the embodiments where the PA1 is always on during operation of the segmented PA arrangement as shown in FIG. 1 and/or FIG. 10, the threshold when the second PA2 turns on may depend not only on the input power to the PA2, but also on the coupling circuits associated with the PA1 and PA2.

Figure 14:
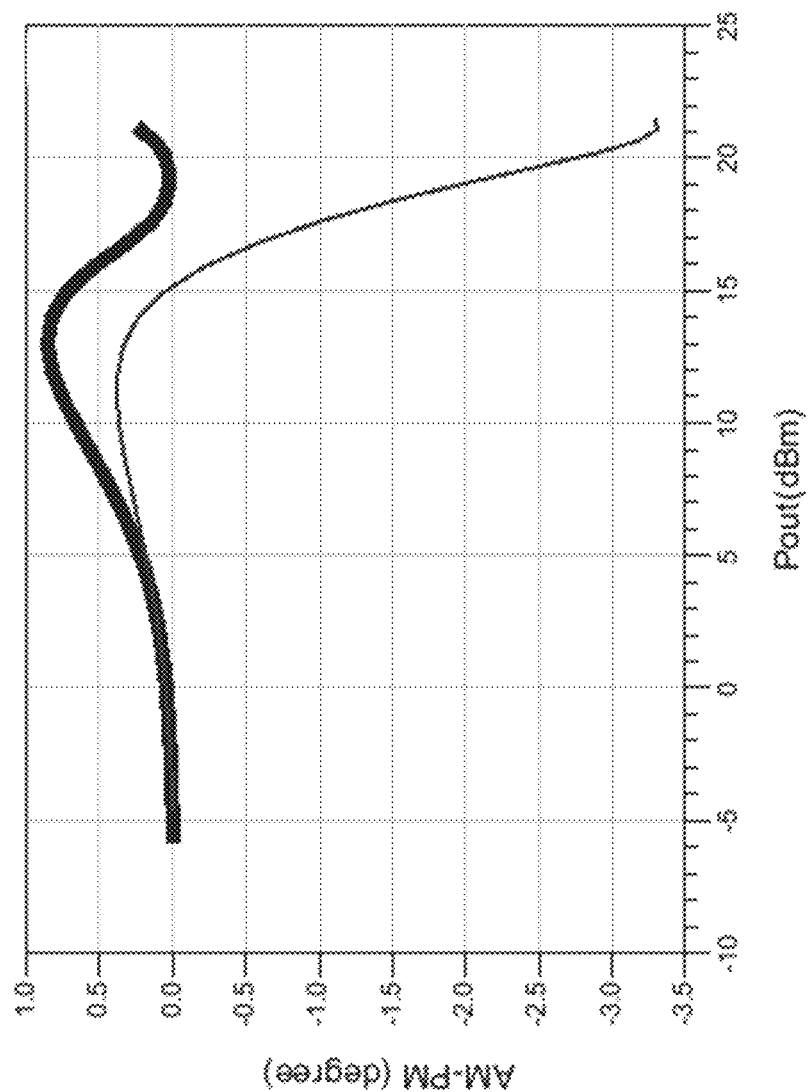
FIG. 14 provides example illustrations of a normalized AM-PM (or output phase) as a function of an output power Pout for a single segment PA and a two segment PA, according to some embodiments of the present disclosure.

Thus, as the foregoing illustrates, in some embodiments, linearization circuits included within the adaptive bias circuits 120 may be configured to further control when the PA2 is turned on. In some embodiments, the first adaptive bias circuit 120-1 may be referred to as, or include, a relatively low nonlinearity linearizer that can generate the required harmonic(s) of the at least first tone component to improve the nonlinearity of the PA1 at relatively low output power, while the second adaptive bias circuit 120-2 may be referred to as, or include, a relatively high nonlinearity linearizer that can generate the required harmonic(s) of the at least second tone component to reduce or cancel the nonlinearity of the PA2 at relatively high output power. To that end, an amplitude of at least one harmonic (e.g., second and higher harmonic) of the at least one first tone component of the bias signal 121-1 may be smaller than an amplitude of at least one harmonic (e.g., second and higher harmonic) of the at least one second tone component of the bias signal 121-2. To implement this, in some embodiments, the first adaptive bias circuit 120-1 may include a first linearization circuit that includes a first linearization transistor and a first resistor, coupled to the first linearization transistor, while the second adaptive bias circuit 120-2 may include a second linearization circuit that includes a second linearization transistor and a second resistor, coupled to the second linearization transistor, where an aspect ratio of the first linearization transistor is higher than an aspect ratio of the second linearization transistor, and a resistance of the first resistor is lower than a resistance of the second resistor. When the linearization circuit of a given adaptive bias circuit 120 is implemented as the linearization circuit 220 as shown in FIGS. 3-7, such a linearization transistor may be the linearization transistor(s) 322, while the resistor coupled thereto may be the resistor 326, shown in FIGS. 3-7. Having a larger linearization transistor and a smaller resistor coupled to the linearization transistor in the first adaptive bias circuit 120-1, compared to the second adaptive bias circuit 120-2, may result in the first adaptive bias circuit 120-1 operating as a relatively low nonlinearity linearizer while the second adaptive bias circuit 120-2 operating as a relatively high nonlinearity linearizer, which may allow the PA2 to linearize the phase response of the PA1. An illustration of this is provided in FIG. 14, providing example illustrations of a normalized output signal phase or the amplitude (i.e., AM) to a phase modulation (i.e., PM, where "P" stands for "phase" and "M" stands for "modulation") of a signal (depicted along the vertical axis) as a function of an output power Pout (depicted along the horizontal axis) for PA output signals that may be generated by the PAs of the segmented PA arrangements 100 and/or 1000, according to some embodiments of the present disclosure. The thin line shown in FIG. 14 illustrates the normalized output phase (AM-PM) of a single segment PA (or a single core PA), while the thick line shown in FIG. 14 illustrates the normalized output phase (AM-PM) of a two segmented PA (e.g., an example of the combined output signal 151 that includes contributions from the PA1 and the PA2 of the segmented PA arrangements 100 and/or 1000). As can be seen in FIG. 14, when at least two segmented PAs are used as described herein, the AM-PM may be flatter for higher output power (meaning that the compression may be moved to higher output power), which would lead to an improved linearity performance.

As the foregoing illustrates, the bias signals 121 provided to the respective PAs 130 may be dependent (i.e., adaptive) not only on the input power to the respective PAs 130 and on the coupling circuit optimizations between the adaptive bias circuits 120 and the respective PAs 130, but also on the nonlinearity of the linearization circuits included in the adaptive bias circuits 120. Thus, for the embodiments where the PA1 is always on during operation of the segmented PA arrangement as shown in FIG. 1 and/or FIG. 10, the threshold when the second PA2 turns on may depend not only on the input power to the PA2 and on the coupling circuits associated with the PA1 and PA2, but also on the nonlinearity of the linearization circuits included in the adaptive bias circuits 120.

Turning to the power splitting between the individual segments 102, in some embodiments, the power splitting may be controlled by the respective input matching circuits 110. For example, the first input matching circuit 110-1 may include a first capacitor (e.g., a capacitor Cin_1, shown in FIG. 10), coupled between the input signal 101 and the input to the PA1, while the second input matching circuit 110-2 may include a second capacitor (e.g., a capacitor Cin_2, shown in FIG. 10), coupled between the input signal 101 and the input to the PA2. Ensuring that the capacitance of the second capacitor is smaller than the capacitance of the first capacitor may be used to ensure that more input power is provided to the first segment 102-1. For example, in some embodiments, the capacitance of Cin_2 may be about 2 times smaller than the capacitance of Cin_1 for about 75:25% power split between the first PA segment 102-1 and the second PA segment 102-2. Unequal input power splitting between the first and second PA segments 102 may be used to minimize gain reduction due to the loading of the PA that is initially off (i.e., the PA2 since the PA1 is always on in operation). As the turn on voltage of the PA2 does not only depend on the input voltage to the PA2 but also on its coupling and adaptive circuits optimizations (e.g., on the coupling circuit as described above and on the linearity of the linearizer circuits of the adaptive bias circuits 120, as described above), 75:25% power split between the first PA segment 102-1 and the second PA segment 102-2 may be particularly advantageous, although, in other embodiments, other values of unequal splitting proportions may be used.

In some embodiments, the power splitting between the between the PA segments 102 may be further assisted/controlled by the components of the respective PAs 130. For example, in some embodiments, the power splitting circuit may further include a first inductor (e.g., an inductor Ls_1, shown in FIG. 10) included in the first PA segment 102-1 (e.g., in the PA1) and a second inductor (e.g., an inductor Ls_2, shown in FIG. 10) included in the second PA segment 102-2 (e.g., in the PA2), where the first inductor is coupled between an input transistor of the PA1 (e.g., coupled to a S/D terminal of the input transistor of the PA1, as shown in FIG. 10) and a first reference voltage, the second inductor is coupled between an input transistor of the PA2 (e.g., coupled to a S/D terminal of the input transistor of the PA2, as shown in FIG. 10) and a second reference voltage, and an inductance of the second inductor is smaller than an inductance of the first inductor. In this context, each of the first and second reference voltages may be a ground voltage, if the input transistor of a given PA is an N-type transistor (as is shown in the illustration of FIG. 10), or a supply voltage if the input transistor is a P-type transistor.

Figure 15:
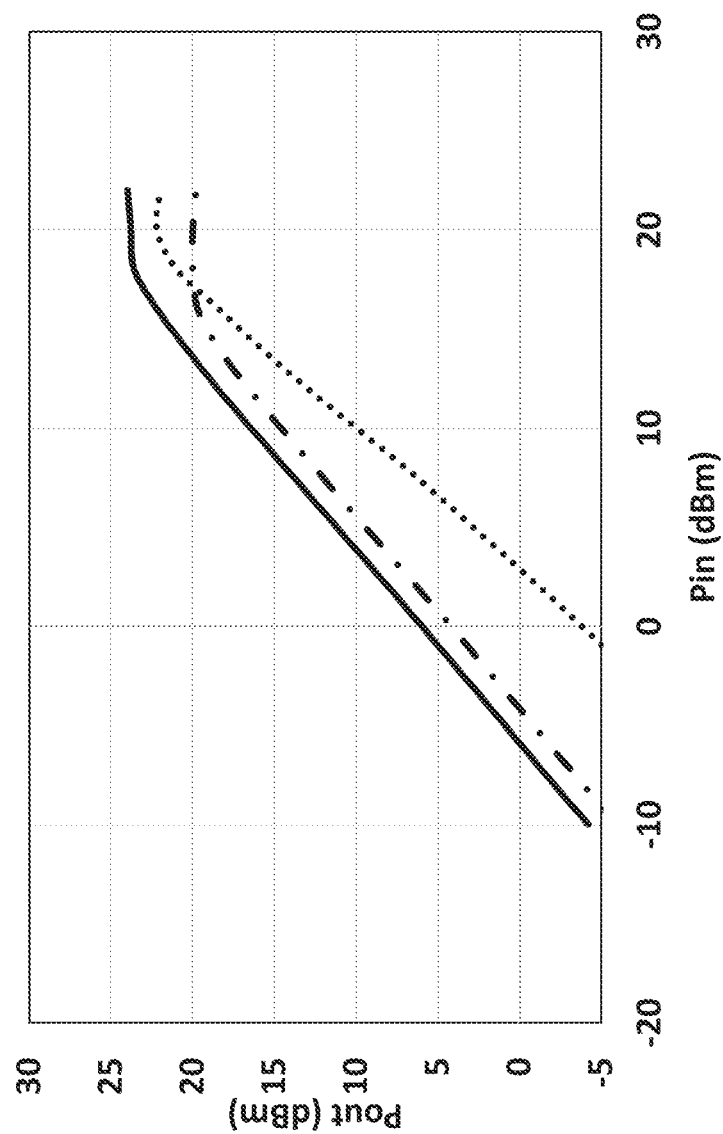
FIG. 15 provides example illustrations of an output power as a function of an input power for the first and second segments of the segmented PA arrangements as shown in FIG. 1 and/or FIG. 10, according to some embodiments of the present disclosure.

In some embodiments, the output matching of the individual PA segments 102 may be optimized using output matching circuits 140. In particular, the output matching circuits 140 may be optimized to provide a specific load impedance at specific output powers required from each PA 130. For example, the first output matching circuit 140-1 may be configured to provide the optimum load to the first PA output signal 141-1 in order to provide optimum loading for the back-off (i.e., low) input power efficiency and linearity, while the second output matching circuit 140-2 may be configured to achieve the maximum output power for the combined output signal 151. In some such embodiments, the first output matching circuit 140-1 may include a first output inductor (e.g., an inductor Lout_1, shown in FIG. 10), configured to receive the output of the PA1, while the second output matching circuit 140-2 may include a second output inductor (e.g., an inductor Lout_2, shown in FIG. 10), configured to receive the output of the PA2. The inductors Lout may represent the output matching before the combiner 150. In some embodiments, an inductance of the second output inductor may be smaller than an inductance of the first output inductor. Larger inductance of the output inductor Lout_1 may help realize relatively high gain and high linearity from the PA1 at lower input power, while smaller inductance of the output inductor Lout_2 may help maximize the output power of the PA2. For single-ended implementations, each of Lout_1 and L_out2 may be followed by a capacitor for DC blocking. An optimization of the output power is illustrated in FIG. 15, providing example illustrations of an output power (depicted along the vertical axis) as a function of an input power (depicted along the horizontal axis) for the first and second segments of the segmented PA arrangements as shown in FIG. 1 and/or FIG. 10, according to some embodiments of the present disclosure. In FIG. 15, the dash-dotted line illustrates the output power as a function of the input power Pin for the first PA segment 102-1 (e.g., illustrating an example for the first PA output signal 131-1), the dotted line illustrates the output power as a function of the input power Pin for the second PA segment 102-2 (e.g., illustrating an example for the second PA output signal 131-2), while the solid line illustrates the output power as a function of the input power Pin for the combined output signal from the segmented PA arrangement 100 and/or 1000 (e.g., illustrating an example for the combined output signal 151). As is shown in FIG. 15, the output power curve for the PA1 has a lower slope and flattens out at a lower output power value than the output power curve for the PA2. The output power curve for the PA2 illustrates that the PA2 starts to contribute to the combined output power after a certain input power threshold (~6:12 dBm), with higher slope than that of the output power curve of the PA1, to compensate the power compression of the PA1. As is also shown in FIG. 15, the output power curve for the PA2 shows higher output power at higher input power to maximize the combined output power.

Another factor that may be used to control the output power of the individual PA segments 102 is the number of stacked transistors used therein. FIG. 10 illustrates that the PA1 may include m stacked transistors, while the PA2 may include n stacked transistors, where each of m and n is an integer greater than zero. In some embodiments, m may be smaller than n, so that the overall PA efficiency is maximized, as the PA1 is supposed to generate lower output power than the PA2, where the supply of voltage of the PA1 could be lower than that of the PA2. Each PA core may be designed with the proper supply voltage that will maximize the efficiency of this core, where each core has at least the minimum number of stacked transistors to guarantee the required output power under reliable operation. Typically, lower output power with high efficiency requires lower supply voltage with lower number of stacked transistors which is the case for PA1. However, higher output power with high efficiency requires higher supply voltage with higher number of stacked transistors which is the case for PA2. The size of the transistors included in the individual PAs 130 may be used to control the overall gain, output average power, and maximum output power. In some embodiments, the sizes of the transistors included in the PA1 may be selected to define the required overall gain and output average power, while the sizes of the transistors included in the PA2 may be selected to define the required maximum output power. The differences between the transistor sizes of the first and second PAs 130 may define how much efficiency may be improved. For example, in some embodiments the sizes of the transistors included in the PA1 may be smaller than the sizes of the transistors included in the PA2. Employing transistors of smaller sizes in the PA1 may lead to lower DC power and average power of the PA output, which may be compensated by employing transistors of larger sizes in the PA2 to achieve the target total output power for the combined output signal 151. Furthermore, the supply voltages provided to different transistors in the PA1 and PA2 may be different. For example, in some embodiments the supply voltage provided to each of the transistors included in the PA1 (e.g., the supply voltage Vs1, shown in FIG. 10) may be smaller than the supply voltage provided to each of the transistors included in the PA2 (e.g., the supply voltage Vs2, shown in FIG. 10). In some embodiments, the supply voltage ratio of the PA1 and the PA2 may be dependent on the output power ratio between the PA1 and the PA2.

Figure 16:
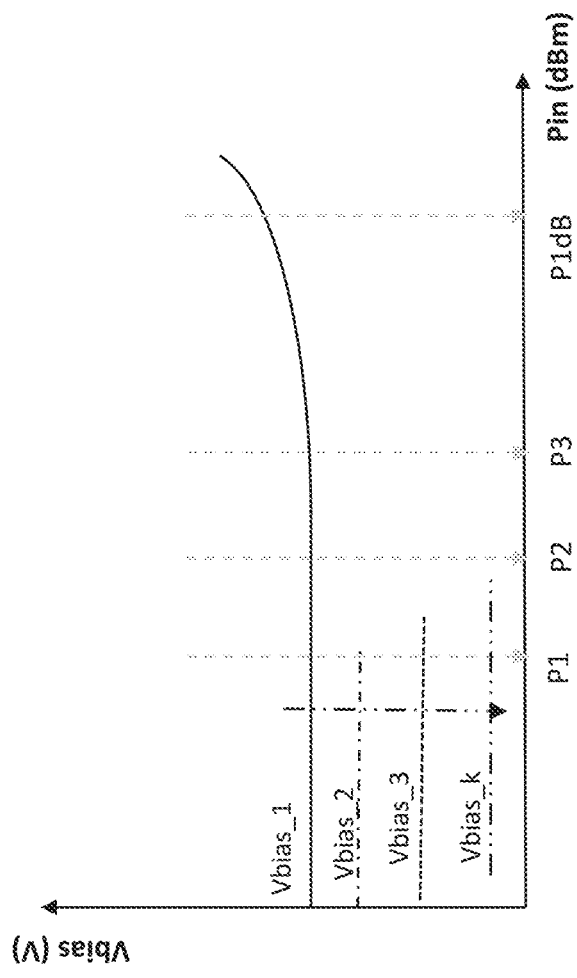
FIG. 16 provides example illustrations of a bias signal amplitude as a function of an input power for k segments of the segmented PA arrangements as shown in FIG. 1 and/or FIG. 10, according to some embodiments of the present disclosure.

While the descriptions provided above refer to segmented PA arrangements with two PA segments 102, in further embodiments, these descriptions may be extended to the embodiments where the segmented PA arrangements 100 and/or 1000 include any number k of the PA segments 102, where k is an integer greater than 1. In some embodiments, the adaptive bias signals for subsequent PAs may be related to one another as shown in FIG. 16, providing example illustrations of a bias signal amplitude as a function of an input power for k segments of the segmented PA arrangements as shown in FIG. 1 and/or FIG. 10, according to some embodiments of the present disclosure. The adaptive bias signals and coupling of said signals to the respective PAs may be optimized to support currents at different input powers, which will result in higher efficiency.

While the illustrations of FIGS. 1 and 10 do not specifically show the PA driver stages (i.e., the drivers used to drive the respective PAs), in some embodiments, splitting the PA driver into multiple segments (e.g., with each driver segment corresponding to a different respective PA 130) and employing adaptive biasing techniques as described herein may also be applied to the PA drivers. Thus, in general, the descriptions provided above with respect to the adaptive bias circuits 120 providing bias signals 121 to the respective PAs 130 are applicable to adaptive bias circuits that may be configured to provide bias signals for the different drivers of a segmented PA driver arrangement, and the descriptions provided above with respect to the coupling of the adaptive bias circuits 120 to the inputs of respective PAs 130 are applicable to coupling the outputs of adaptive bias circuits to the input of respective drivers for the respective PAs 130.

Example Systems and Devices

Segmented PA arrangements with feedforward adaptive bias circuits as described herein may be included in various RF devices and systems used in wireless or cable communications. For illustration purposes only, one example RF device that may include one or more segmented PA arrangements with feedforward adaptive bias circuits, according to some embodiments of the present disclosure, is shown in FIG. 17 and described below.

Figure 17:
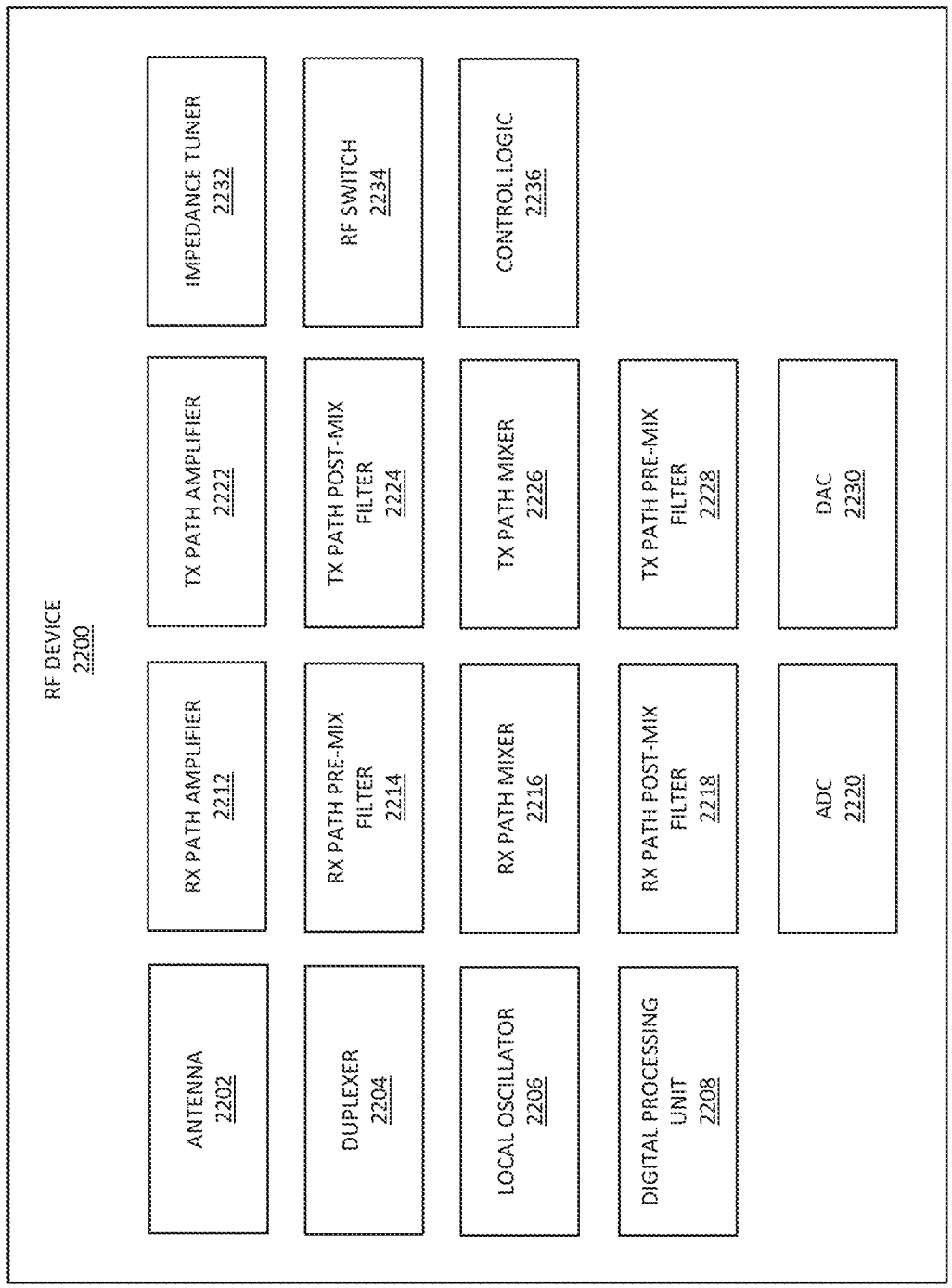
FIG. 17 is a block diagram of an example RF device that may include one or more segmented PA arrangements with feedforward adaptive bias circuits, according to some embodiments of the present disclosure.

FIG. 17 is a block diagram of an example RF device 2200, e.g., an RF transceiver, that may include one or more segmented PA arrangements with feedforward adaptive bias circuits, according to some embodiments of the present disclosure.

In general, the RF device 2200 may be any device or system that may support wireless transmission and/or reception of signals in the form of electromagnetic waves in the RF range of approximately 3 kilohertz (kHz) to approximately 300 Gigahertz (GHz). In some embodiments, the RF device 2200 may be used for wireless communications, e.g., in a base station (BS) or a UE device of any suitable cellular wireless communications technology, such as GSM, WCDMA, or LTE. In a further example, the RF device 2200 may be used as, or in, e.g., a BS or a UE device of a millimeter-wave wireless technology such as fifth generation (5G) wireless (i.e., high-frequency/short wavelength spectrum, e.g., with frequencies in the range between about 20 and 60 GHz, corresponding to wavelengths in the range between about 5 and 15 millimeters). In yet another example, the RF device 2200 may be used for wireless communications using Wi-Fi technology (e.g., a frequency band of 2.4 GHz, corresponding to a wavelength of about 12 cm, or a frequency band of 5.8 GHz, spectrum, corresponding to a wavelength of about 5 cm), e.g., in a Wi-Fi-enabled device such as a desktop, a laptop, a video game console, a smart phone, a tablet, a smart TV, a digital audio player, a car, a printer, etc. In some implementations, a Wi-Fi-enabled device may, e.g., be a node in a smart system configured to communicate data with other nodes, e.g., a smart sensor. Still in another example, the RF device 2200 may be used for wireless communications using Bluetooth technology (e.g., a frequency band from about 2.4 to about 2.485 GHz, corresponding to a wavelength of about 12 cm). In other embodiments, the RF device 2200 may be used for transmitting and/or receiving RF signals for purposes other than communication, e.g., in an automotive radar system, or in medical applications such as magneto-resonance imaging (MRI).

In various embodiments, the RF device 2200 may be included in frequency-division duplex (FDD) or time-domain duplex (TDD) variants of frequency allocations that may be used in a cellular network. In an FDD system, the uplink (i.e., RF signals transmitted from the UE devices to a BS) and the downlink (i.e., RF signals transmitted from the BS to the US devices) may use separate frequency bands at the same time. In a TDD system, the uplink and the downlink may use the same frequencies but at different times.

Several components are illustrated in FIG. 17 as included in the RF device 2200, but any one or more of these components may be omitted or duplicated, as suitable for the application. For example, in some embodiments, the RF device 2200 may be an RF device supporting both of wireless transmission and reception of RF signals (e.g., an RF transceiver), in which case it may include both the components of what is referred to herein as a transmit (TX) path and the components of what is referred to herein as a receive (RX) path. However, in other embodiments, the RF device 2200 may be an RF device supporting only wireless reception (e.g., an RF receiver), in which case it may include the components of the RX path, but not the components of the TX path; or the RF device 2200 may be an RF device supporting only wireless transmission (e.g., an RF transmitter), in which case it may include the components of the TX path, but not the components of the RX path.

In some embodiments, some or all the components included in the RF device 2200 may be attached to one or more motherboards. In some embodiments, some or all these components are fabricated on a single die, e.g., on a single system on chip (SoC) die.

Additionally, in various embodiments, the RF device 2200 may not include one or more of the components illustrated in FIG. 17, but the RF device 2200 may include interface circuitry for coupling to the one or more components. For example, the RF device 2200 may not include an antenna 2202, but may include antenna interface circuitry (e.g., a matching circuitry, a connector and driver circuitry) to which an antenna 2202 may be coupled. In another set of examples, the RF device 2200 may not include a digital processing unit 2208 or a local oscillator 2206, but may include device interface circuitry (e.g., connectors and supporting circuitry) to which a digital processing unit 2208 or a local oscillator 2206 may be coupled.

As shown in FIG. 17, the RF device 2200 may include an antenna 2202, a duplexer 2204 (e.g., if the RF device 2200 is an FDD RF device; otherwise the duplexer 2204 may be omitted), a local oscillator 2206, a digital processing unit 2208. As also shown in FIG. 17, the RF device 2200 may include an RX path that may include an RX path amplifier 2212, an RX path pre-mix filter 2214, a RX path mixer 2216, an RX path post-mix filter 2218, and an analog-to-digital converter (ADC) 2220. As further shown in FIG. 17, the RF device 2200 may include a TX path that may include a TX path amplifier 2222, a TX path post-mix filter 2224, a TX path mixer 2226, a TX path pre-mix filter 2228, and a digital-to-analog converter (DAC) 2230. Still further, the RF device 2200 may further include an impedance tuner 2232, an RF switch 2234, and control logic 2236. In various embodiments, the RF device 2200 may include multiple instances of any of the components shown in FIG. 17. In some embodiments, the RX path amplifier 2212, the TX path amplifier 2222, the duplexer 2204, and the RF switch 2234 may be considered to form, or be a part of, an RF front-end (FE) of the RF device 2200. In some embodiments, the RX path amplifier 2212, the TX path amplifier 2222, the duplexer 2204, and the RF switch 2234 may be considered to form, or be a part of, an RF FE of the RF device 2200. In some embodiments, the RX path mixer 2216 and the TX path mixer 2226 (possibly with their associated pre-mix and post-mix filters shown in FIG. 17) may be considered to form, or be a part of, an RF transceiver of the RF device 2200 (or of an RF receiver or an RF transmitter if only RX path or TX path components, respectively, are included in the RF device 2200). In some embodiments, the RF device 2200 may further include one or more control logic elements/circuits, shown in FIG. 17 as control logic 2236, e.g., an RF FE control interface. In some embodiments, the control logic 2236 may be configured to control at least portions of operating any of the segmented PA arrangements with feedforward adaptive bias circuits, as described herein, e.g., within the TX path amplifier 2222 of the RF device 2200. In some embodiments, the control logic 2236 may be used to perform control other functions within the RF device 2200, e.g., enhance control of complex RF system environment, support implementation of envelope tracking techniques, reduce dissipated power, etc.

The antenna 2202 may be configured to wirelessly transmit and/or receive RF signals in accordance with any wireless standards or protocols, e.g., Wi-Fi, LTE, or GSM, as well as any other wireless protocols that are designated as 3G, 4G, 5G, and beyond. If the RF device 2200 is an FDD transceiver, the antenna 2202 may be configured for concurrent reception and transmission of communication signals in separate, i.e., non-overlapping and non-continuous, bands of frequencies, e.g., in bands having a separation of, e.g., 20 MHz from one another. If the RF device 2200 is a TDD transceiver, the antenna 2202 may be configured for sequential reception and transmission of communication signals in bands of frequencies that may be the same or overlapping for TX and RX paths. In some embodiments, the RF device 2200 may be a multi-band RF device, in which case the antenna 2202 may be configured for concurrent reception of signals having multiple RF components in separate frequency bands and/or configured for concurrent transmission of signals having multiple RF components in separate frequency bands. In such embodiments, the antenna 2202 may be a single wide-band antenna or a plurality of band-specific antennas (i.e., a plurality of antennas each configured to receive and/or transmit signals in a specific band of frequencies). In various embodiments, the antenna 2202 may include a plurality of antenna elements, e.g., a plurality of antenna elements forming a phased antenna array (i.e., a communication system or an array of antennas that may use a plurality of antenna elements and phase shifting to transmit and receive RF signals). Compared to a single-antenna system, a phased antenna array may offer advantages such as increased gain, ability of directional steering, and simultaneous communication. In some embodiments, the RF device 2200 may include more than one antenna 2202 to implement antenna diversity. In some such embodiments, the RF switch 2234 may be deployed to switch between different antennas.

An output of the antenna 2202 may be coupled to the input of the duplexer 2204. The duplexer 2204 may be any suitable component configured for filtering multiple signals to allow for bidirectional communication over a single path between the duplexer 2204 and the antenna 2202. The duplexer 2204 may be configured for providing RX signals to the RX path of the RF device 2200 and for receiving TX signals from the TX path of the RF device 2200.

The RF device 2200 may include one or more local oscillators 2206, configured to provide local oscillator signals that may be used for downconversion of the RF signals received by the antenna 2202 and/or upconversion of the signals to be transmitted by the antenna 2202.

The RF device 2200 may include the digital processing unit 2208, which may include one or more processing devices. The digital processing unit 2208 may be configured to perform various functions related to digital processing of the RX and/or TX signals. Examples of such functions include, but are not limited to, decimation/downsampling, error correction, digital downconversion or upconversion, DC offset cancellation, automatic gain control, etc. Although not shown in FIG. 17, in some embodiments, the RF device 2200 may further include a memory device, configured to cooperate with the digital processing unit 2208.

Turning to the details of the RX path that may be included in the RF device 2200, the RX path amplifier 2212 may include a low-noise amplifier (LNA). An input of the RX path amplifier 2212 may be coupled to an antenna port (not shown) of the antenna 2202, e.g., via the duplexer 2204. The RX path amplifier 2212 may amplify the RF signals received by the antenna 2202.

An output of the RX path amplifier 2212 may be coupled to an input of the RX path pre-mix filter 2214, which may be a harmonic or band-pass (e.g., low-pass) filter, configured to filter received RF signals that have been amplified by the RX path amplifier 2212.

An output of the RX path pre-mix filter 2214 may be coupled to an input of the RX path mixer 2216, also referred to as a downconverter. The RX path mixer 2216 may include two inputs and one output. A first input may be configured to receive the RX signals, which may be current signals, indicative of the signals received by the antenna 2202 (e.g., the first input may receive the output of the RX path pre-mix filter 2214). A second input may be configured to receive local oscillator signals from one of the local oscillators 2206. The RX path mixer 2216 may then mix the signals received at its two inputs to generate a downconverted RX signal, provided at an output of the RX path mixer 2216. As used herein, downconversion refers to a process of mixing a received RF signal with a local oscillator signal to generate a signal of a lower frequency. In particular, the TX path mixer (e.g., downconverter) 2216 may be configured to generate the sum and/or the difference frequency at the output port when two input frequencies are provided at the two input ports. In some embodiments, the RF device 2200 may implement a direct-conversion receiver (DCR), also known as homodyne, synchrodyne, or zero-IF receiver, in which case the RX path mixer 2216 may be configured to demodulate the incoming radio signals using local oscillator signals whose frequency is identical to, or very close to the carrier frequency of the radio signal. In other embodiments, the RF device 2200 may make use of downconversion to an intermediate frequency (IF). IFs may be used in superheterodyne radio receivers, in which a received RF signal is shifted to an IF before the final detection of the information in the received signal is done. Conversion to an IF may be useful for several reasons. For example, when several stages of filters are used, they can all be set to a fixed frequency, which makes them easier to build and to tune. In some embodiments, the RX path mixer 2216 may include several such stages of IF conversion.

Although a single RX path mixer 2216 is shown in the RX path of FIG. 17, in some embodiments, the RX path mixer 2216 may be implemented as a quadrature downconverter, in which case it would include a first RX path mixer and a second RX path mixer. The first RX path mixer may be configured for performing downconversion to generate an in-phase (I) downconverted RX signal by mixing the RX signal received by the antenna 2202 and an in-phase component of the local oscillator signal provided by the local oscillator 2206. The second RX path mixer may be configured for performing downconversion to generate a quadrature (Q) downconverted RX signal by mixing the RX signal received by the antenna 2202 and a quadrature component of the local oscillator signal provided by the local oscillator 2206 (the quadrature component is a component that is offset, in phase, from the in-phase component of the local oscillator signal by 90 degrees). The output of the first RX path mixer may be provided to a I-signal path, and the output of the second RX path mixer may be provided to a Q-signal path, which may be substantially 90 degrees out of phase with the I-signal path.

The output of the RX path mixer 2216 may, optionally, be coupled to the RX path post-mix filter 2218, which may be low-pass filters. In case the RX path mixer 2216 is a quadrature mixer that implements the first and second mixers as described above, the in-phase and quadrature components provided at the outputs of the first and second mixers respectively may be coupled to respective individual first and second RX path post-mix filters included in the filter 2218.

The ADC 2220 may be configured to convert the mixed RX signals from the RX path mixer 2216 from analog to digital domain. The ADC 2220 may be a quadrature ADC that, like the RX path quadrature mixer 2216, may include two ADCs, configured to digitize the downconverted RX path signals separated in in-phase and quadrature components. The output of the ADC 2220 may be provided to the digital processing unit 2208, configured to perform various functions related to digital processing of the RX signals so that information encoded in the RX signals can be extracted.

Turning to the details of the TX path that may be included in the RF device 2200, the digital signal to later be transmitted (TX signal) by the antenna 2202 may be provided, from the digital processing unit 2208, to the DAC 2230. Like the ADC 2220, the DAC 2230 may include two DACs, configured to convert, respectively, digital I- and Q-path TX signal components to analog form.

Optionally, the output of the DAC 2230 may be coupled to the TX path pre-mix filter 2228, which may be a bandpass (e.g., low-pass) filter (or a pair of band-pass, e.g., low-pass, filters, in case of quadrature processing) configured to filter out, from the analog TX signals output by the DAC 2230, the signal components outside of the desired band. The digital TX signals may then be provided to the TX path mixer 2226, which may also be referred to as an upconverter. Like the RX path mixer 2216, the TX path mixer 2226 may include a pair of TX path mixers, for in-phase and quadrature component mixing. Like the first and second RX path mixers that may be included in the RX path, each of the TX path mixers of the TX path mixer 2226 may include two inputs and one output. A first input may receive the TX signal components, converted to the analog form by the respective DAC 2230, which are to be upconverted to generate RF signals to be transmitted. The first TX path mixer may generate an in-phase (I) upconverted signal by mixing the TX signal component converted to analog form by the DAC 2230 with the in-phase component of the TX path local oscillator signal provided from the local oscillator 2206 (in various embodiments, the local oscillator 2206 may include a plurality of different local oscillators, or be configured to provide different local oscillator frequencies for the mixer 2216 in the RX path and the mixer 2226 in the TX path). The second TX path mixer may generate a quadrature phase (Q) upconverted signal by mixing the TX signal component converted to analog form by the DAC 2230 with the quadrature component of the TX path local oscillator signal. The output of the second TX path mixer may be added to the output of the first TX path mixer to create a real RF signal. A second input of each of the TX path mixers may be coupled the local oscillator 2206.

Optionally, the RF device 2200 may include the TX path post-mix filter 2224, configured to filter the output of the TX path mixer 2226.

The TX path amplifier 2222 may include any embodiments of the segmented PA arrangements with feedforward adaptive bias circuits as described herein.

In various embodiments, any of the RX path pre-mix filter 2214, the RX path post-mix filter 2218, the TX post-mix filter 2224, and the TX pre-mix filter 2228 may be implemented as RF filters. In some embodiments, an RF filter may be implemented as a plurality of RF filters, or a filter bank. A filter bank may include a plurality of RF filters that may be coupled to a switch, e. g., the RF switch 2234, configured to selectively switch any one of the plurality of RF filters on and off (e.g., activate any one of the plurality of RF filters), in order to achieve desired filtering characteristics of the filter bank (i.e., in order to program the filter bank). For example, such a filter bank may be used to switch between different RF frequency ranges when the RF device 2200 is, or is included in, a BS or in a UE device. In another example, such a filter bank may be programmable to suppress TX leakage on the different duplex distances.

The impedance tuner 2232 may include any suitable circuitry, configured to match the input and output impedances of the different RF circuitries to minimize signal losses in the RF device 2200. For example, the impedance tuner 2232 may include an antenna impedance tuner. Being able to tune the impedance of the antenna 2202 may be particularly advantageous because antenna's impedance is a function of the environment that the RF device 2200 is in, e.g., antenna's impedance changes depending on, e.g., if the antenna is held in a hand, placed on a car roof, etc.

As described above, the RF switch 2234 may be a device configured to route high-frequency signals through transmission paths, e.g., in order to selectively switch between a plurality of instances of any one of the components shown in FIG. 17, e.g., to achieve desired behavior and characteristics of the RF device 2200. For example, in some embodiments, an RF switch may be used to switch between different antennas 2202. In other embodiments, an RF switch may be used to switch between a plurality of RF filters (e.g., by selectively switching RF filters on and off) of the RF device 2200. Typically, an RF system would include a plurality of such RF switches.

The RF device 2200 provides a simplified version and, in further embodiments, other components not specifically shown in FIG. 17 may be included. For example, the RX path of the RF device 2200 may include a current-to-voltage amplifier between the RX path mixer 2216 and the ADC 2220, which may be configured to amplify and convert the downconverted signals to voltage signals. In another example, the RX path of the RF device 2200 may include a balun transformer for generating balanced signals. In yet another example, the RF device 2200 may further include a clock generator, which may, e.g., include a suitable phased-lock loop (PLL), configured to receive a reference clock signal and use it to generate a different clock signal that may then be used for timing the operation of the ADC 2220, the DAC 2230, and/or that may also be used by the local oscillator 2206 to generate the local oscillator signals to be used in the RX path or the TX path.

Example Data Processing System

Figure 18:
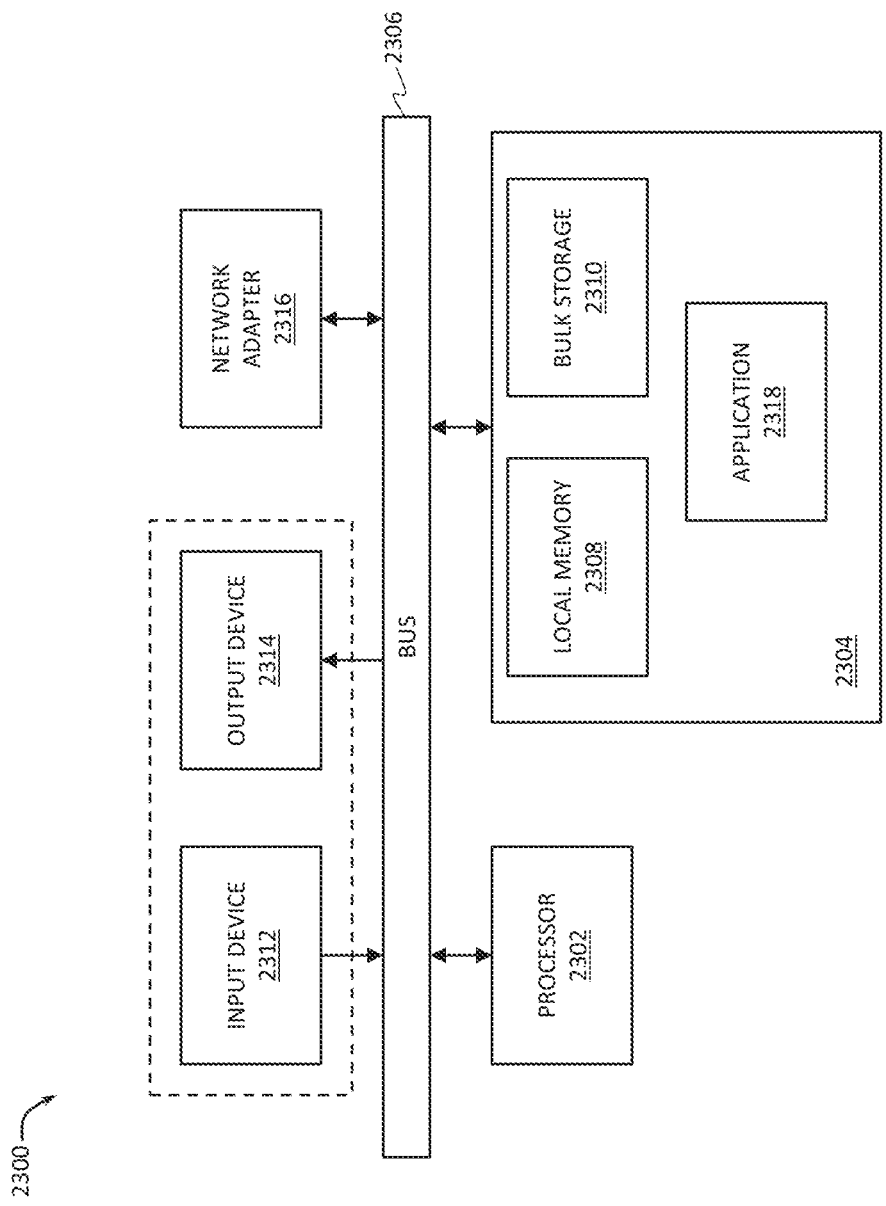
FIG. 18 provides a block diagram illustrating an example data processing system that may be configured to control operation of a segmented PA arrangement with feedforward adaptive bias circuits, according to some embodiments of the present disclosure.

FIG. 18 provides a block diagram illustrating an example data processing system 2300 that may be configured to control operation of one or more segmented PA arrangements with feedforward adaptive bias circuits as described herein, according to some embodiments of the present disclosure. For example, the data processing system 2300 may be configured to implement or control portions of the segmented PA arrangements 100 and/or 1000, or any further embodiments of the segmented PA arrangements with feedforward adaptive bias circuits as described herein. In another example, the data processing system 2300 may be configured to implement at least portions of the control logic 2236, shown in FIG. 17.

As shown in FIG. 18, the data processing system 2300 may include at least one processor 2302, e.g. a hardware processor 2302, coupled to memory elements 2304 through a system bus 2306. As such, the data processing system may store program code within memory elements 2304. Further, the processor 2302 may execute the program code accessed from the memory elements 2304 via a system bus 2306. In one aspect, the data processing system may be implemented as a computer that is suitable for storing and/or executing program code. It should be appreciated, however, that the data processing system 2300 may be implemented in the form of any system including a processor and a memory that is capable of performing the functions described within this disclosure.

In some embodiments, the processor 2302 can execute software or an algorithm to perform the activities as discussed in the present disclosure, in particular activities related to operating segmented PA arrangements with feedforward adaptive bias circuits as described herein. The processor 2302 may include any combination of hardware, software, or firmware providing programmable logic, including by way of non-limiting example a microprocessor, a digital signal processor (DSP), a field-programmable gate array (FPGA), a programmable logic array (PLA), an application specific integrated circuit (IC) (ASIC), or a virtual machine processor. The processor 2302 may be communicatively coupled to the memory element 2304, for example in a direct-memory access (DMA) configuration, so that the processor 2302 may read from or write to the memory elements 2304.

In general, the memory elements 2304 may include any suitable volatile or non-volatile memory technology, including double data rate (DDR) random access memory (RAM), synchronous RAM (SRAM), dynamic RAM (DRAM), flash, read-only memory (ROM), optical media, virtual memory regions, magnetic or tape memory, or any other suitable technology. Unless specified otherwise, any of the memory elements discussed herein should be construed as being encompassed within the broad term "memory." The information being measured, processed, tracked or sent to or from any of the components of the data processing system 2300 could be provided in any database, register, control list, cache, or storage structure, all of which can be referenced at any suitable timeframe. Any such storage options may be included within the broad term "memory" as used herein. Similarly, any of the potential processing elements, modules, and machines described herein should be construed as being encompassed within the broad term "processor." Each of the elements shown in the present figures, e.g., any elements illustrating segmented PA arrangements with feedforward adaptive bias circuits as shown in FIGS. 1-18, can also include suitable interfaces for receiving, transmitting, and/or otherwise communicating data or information in a network environment so that they can communicate with, e.g., the data processing system 2300.

In certain example implementations, mechanisms for implementing segmented PA arrangements with feedforward adaptive bias circuits as outlined herein may be implemented by logic encoded in one or more tangible media, which may be inclusive of non-transitory media, e.g., embedded logic provided in an ASIC, in DSP instructions, software (potentially inclusive of object code and source code) to be executed by a processor, or other similar machine, etc. In some of these instances, memory elements, such as e.g. the memory elements 2304 shown in FIG. 18, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 2302 shown in FIG. 18, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., an FPGA, a DSP, an erasable programmable read-only memory (EPROM), an electrically erasable programmable read-only memory (EEPROM)) or an ASIC that includes digital logic, software, code, electronic instructions, or any suitable combination thereof.

The memory elements 2304 may include one or more physical memory devices such as, for example, local memory 2308 and one or more bulk storage devices 2310. The local memory may refer to RAM or other non-persistent memory device(s) generally used during actual execution of the program code. A bulk storage device may be implemented as a hard drive or other persistent data storage device. The processing system 2300 may also include one or more cache memories (not shown) that provide temporary storage of at least some program code in order to reduce the number of times program code must be retrieved from the bulk storage device 2310 during execution.

As shown in FIG. 18, the memory elements 2304 may store an application 2318. In various embodiments, the application 2318 may be stored in the local memory 2308, the one or more bulk storage devices 2310, or apart from the local memory and the bulk storage devices. It should be appreciated that the data processing system 2300 may further execute an operating system (not shown in FIG. 18) that can facilitate execution of the application 2318. The application 2318, being implemented in the form of executable program code, can be executed by the data processing system 2300, e.g., by the processor 2302. Responsive to executing the application, the data processing system 2300 may be configured to perform one or more operations or method steps described herein.

Input/output (I/O) devices depicted as an input device 2312 and an output device 2314, optionally, can be coupled to the data processing system. Examples of input devices may include, but are not limited to, a keyboard, a pointing device such as a mouse, or the like. Examples of output devices may include, but are not limited to, a monitor or a display, speakers, or the like. In some embodiments, the output device 2314 may be any type of screen display, such as plasma display, liquid crystal display (LCD), organic light emitting diode (OLED) display, electroluminescent (EL) display, or any other indicator, such as a dial, barometer, or LEDs. In some implementations, the system may include a driver (not shown) for the output device 2314. Input and/or output devices 2312, 2314 may be coupled to the data processing system either directly or through intervening I/O controllers.

In an embodiment, the input and the output devices may be implemented as a combined input/output device (illustrated in FIG. 18 with a dashed line surrounding the input device 2312 and the output device 2314). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2316 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2300, and a data transmitter for transmitting data from the data processing system 2300 to said systems, devices and/or networks. Modems, cable modems, and Ethernet cards are examples of different types of network adapter that may be used with the data processing system 2300.

Select Examples

The following paragraphs provide various examples of the embodiments disclosed herein.

Example 1 provides a PA arrangement that includes a first and a second PA segment, a power splitting circuit, and a combiner. The first PA segment includes a first PA and a first adaptive bias circuit that is configured to generate a first bias signal for the first PA, the first bias signal having a first DC component, at least one first tone component, and at least one harmonic of the at least one first tone component. The second PA segment includes a second PA and a second adaptive bias circuit that is configured to generate a second bias signal for the second PA, the second bias signal having a second DC component, at least one second tone component, and at least one harmonic of the at least one second tone component, where an amplitude of the at least one harmonic of the at least one first tone component is smaller than an amplitude of the at least one harmonic of the at least one second tone component. The power splitting circuit is configured to split an input signal for the PA arrangement into a first PA input signal, provided to the first PA segment, and a second PA input signal, provided to the second PA segment, where the power splitting circuit includes a first capacitor (e.g., capacitor Cin_1), coupled between an input to the PA arrangement and an input to the first PA, and further includes a second capacitor (e.g., capacitor Cin_1), coupled between the input to the PA arrangement and an input to the second PA, where a capacitance of the second capacitor is smaller than a capacitance of the first capacitor, e.g., about 2 times smaller for about 75:25% power split between the first and second PA segments. The combiner is configured to combine an output of the first PA and an output of the second PA to generate a combined output signal.

Example 2 provides the PA arrangement according to example 1, where the first PA includes m stacked transistors, the second PA includes n stacked transistors, and each of m and n is an integer greater than zero and m is smaller than n.

Example 3 provides the PA arrangement according to example 2, where a supply voltage provided to each of the m stacked first transistors is smaller than a supply voltage provided to each of the n stacked second transistors.

Example 4 provides the PA arrangement according to any one of examples 1-3, where the PA arrangement is the PA arrangement according to any one of examples 9-26.

Example 5 provides a PA arrangement that includes a first and a second PA segment, a power splitting circuit, and a combiner. The first PA segment includes a first PA and a first adaptive bias circuit that is configured to generate a first bias signal for the first PA. The second PA segment includes a second PA and a second adaptive bias circuit that is configured to generate a second bias signal for the second PA, where the first PA includes m stacked transistors, the second PA includes n stacked transistors, each of m and n is an integer greater than zero and m is smaller than n, and a supply voltage provided to each of the m stacked transistors is smaller than a supply voltage provided to each of the n stacked transistors. The power splitting circuit is configured to split an input signal for the PA arrangement into a first PA input signal, provided to the first PA segment, and a second PA input signal, provided to the second PA segment, where a power of the first PA input signal is greater than a power of the second PA input signal. The combiner is configured to combine an output of the first PA and an output of the second PA to generate a combined output signal. The first adaptive bias circuit is configured to generate the first bias signal that is dependent on a power of the input signal in that an amplitude of the first bias signal is at a constant first value (Vbias1) when the power of the input signal is equal to or smaller than a first threshold power (e.g., the threshold identified as Pavg in FIG. 11), and increases at a first rate when the power of the input signal is greater than the first threshold power. The second adaptive bias circuit is configured to generate the second bias signal that is dependent on the power of the input signal in that an amplitude of the second bias signal is at a constant second value (Vbias2) when the power of the input signal is equal to or smaller than a second threshold power, and increases at a second rate when the power of the input signal is greater than the second threshold power, where the constant first value is greater than the constant second value, and the second rate is higher than the first rate.

Example 6 provides the PA arrangement according to example 5, where the first PA output signal has a first gain expansion for output powers of the first PA output signal below a first value, the first PA output signal has a first gain compression for output powers of the first PA output signal above the first value, the second PA output signal has a second gain expansion for output powers of the second PA output signal below a second value, the second PA output signal has a second gain compression for output powers of the second PA output signal above the second value, the second gain expansion is greater than the first gain expansion, and the second value is greater than the first value Example 7 provides the PA arrangement according to examples 5 or 6, where the combined output signal has a third gain expansion (a relatively constant gain, i.e., a low gain expansion) for output powers of the combined output signal below a third value, and the combined output signal has a gain compression for output powers of the combined output signal above the third value, where the third value is greater than the first value and smaller than the second value.

Example 8 provides the PA arrangement according to any one of examples 5-7, where the PA arrangement is the PA arrangement according to any one of examples 9-26.

Example 9 provides a PA arrangement that includes a first and a second PA segment, a power splitting circuit, and a combiner. The first PA segment includes a first PA and a first adaptive bias circuit that is configured to generate a first bias signal for the first PA, the first bias signal having a first DC component (i.e., a component with zero frequency), at least one first tone component (i.e., a component with a non-zero frequency, e.g., a component with a frequency from the RF spectrum), and at least one harmonic of the at least one first tone component (e.g., a second or a higher-order harmonic of the first tone component). The second PA segment includes a second PA and a second adaptive bias circuit that is configured to generate a second bias signal for the second PA, the second bias signal having a second DC component, at least one second tone component, and at least one harmonic of the at least one second tone component (e.g., a second or a higher-order harmonic of the second tone component). The power splitting circuit (e.g., input matching for PA1 and input matching for PA2 circuits, shown in FIG. 1) is configured to split an input signal for the PA arrangement into a first PA input signal, provided to the first PA, and a second PA input signal, provided to the second PA, where a power of the first PA input signal is greater than a power of the second PA input signal. The combiner is configured to combine a first PA output signal and a second PA output signal to generate a combined output signal, where the first PA output signal is a signal generated by the first PA amplifying a signal based on the first PA input signal while being biased by the first bias signal, and where the second PA output signal is a signal generated by the second PA amplifying a signal based on the second PA input signal while being biased by the second bias signal.

Example 10 provides the PA arrangement according to example 9, where each of the first adaptive bias circuit and the second adaptive bias circuit is a feedforward circuit, i.e., an adaptive bias circuit configured to generate a bias signal that adapts (e.g., changes proportionally) to the input power level of the PA segment, and is placed at the input to the PA segment.

Example 11 provides the PA arrangement according to examples 9 or 10, where the first adaptive bias circuit is configured to generate the first bias signal that is dependent on a power of the input signal in that an amplitude of the first bias signal is at a constant first value (Vbias1) when the power of the input signal is equal to or smaller than a first threshold power (e.g., the threshold identified as Pavg. In FIG. 11), and increases at a first rate when the power of the input signal is greater than the first threshold power. In such a PA arrangement, the second adaptive bias circuit is configured to generate the second bias signal that is dependent on the power of the input signal in that an amplitude of the second bias signal is at a constant second value (Vbias2) when the power of the input signal is equal to or smaller than a second threshold power, and increases at a second rate when the power of the input signal is greater than the second threshold power. Furthermore, the constant first value is greater than the constant second value, and the second rate is higher than the first rate.

Example 12 provides the PA arrangement according to any one of examples 9-11, where the first adaptive bias circuit is configured to generate the first bias signal that provides a first gain expansion of the first PA output signal for output powers of the first PA output signal below a first value, and a first gain compression of the first PA output signal for output powers of the first PA output signal above the first value. Furthermore, the second adaptive bias circuit is configured to generate the second bias signal that provides a second gain expansion of the second PA output signal for output powers of the second PA output signal below a second value, and a second gain compression of the second PA output signal for output powers of the second PA output signal above the second value, where the second gain expansion is greater than the first gain expansion, and the second value is greater than the first value.

Example 13 provides the PA arrangement according to example 12, where the first adaptive bias circuit is configured to adapt the first bias signal in combination with the second adaptive bias circuit adapting the second bias signal to provide a third gain expansion (a relatively constant gain, i.e., a low gain expansion) of the combined output signal for output powers of the combined output signal below a third value, and a gain compression of the combined output signal for output powers of the combined output signal above the third value, where the third value is greater than the first value and smaller than the second value.

Example 14 provides the PA arrangement according to example 13, where a gain of the combined output signal for output powers of the combined output signal below the third value is greater than a gain of the first PA output signal for output powers of the first PA output signal below the first value, and a gain of the first PA output signal for output powers of the first PA output signal below the first value is greater than a gain of the second PA output signal for output powers of the second PA output signal below the second value.

Example 15 provides the PA arrangement according to any one of examples 9-14, where the power splitting circuit includes a first capacitor (e.g., capacitor Cin_1) included in the first PA segment and a second capacitor (e.g., capacitor Cin_2) included in the second PA segment, the first capacitor is coupled between the input signal for the PA arrangement and an input to the first PA, the second capacitor is coupled between the input signal for the PA arrangement and an input to the second PA, and a capacitance of the second capacitor is smaller than a capacitance of the first capacitor, e.g., about 2 times smaller for about 75:25% power split between the first and second PA segments.

Example 16 provides the PA arrangement according to example 15, where the power splitting circuit further includes a first inductor (e.g., inductor Ls_1) included in the first PA segment (e.g., in the first PA) and a second inductor (e.g., inductor Ls_2) included in the second PA segment (e.g., in the second PA), the first inductor is coupled between an input transistor of the first PA and a first reference voltage (e.g., a ground voltage, if the input transistor is an N-type transistor, or a supply voltage if the input transistor is a P-type transistor), the second inductor is coupled between an input transistor of the second PA and a second reference voltage (e.g., a ground voltage, if the input transistor is an N-type transistor, or a supply voltage if the input transistor is a P-type transistor), and an inductance of the second inductor is smaller than an inductance of the first inductor.

Example 17 provides the PA arrangement according to any one of examples 9-16, where an amplitude of the at least one harmonic of the at least one first tone component is smaller than an amplitude of the at least one harmonic of the at least one second tone component.

Example 18 provides the PA arrangement according to any one of examples 9-17, where the first adaptive bias circuit includes a first linearization circuit that includes a first linearization transistor and a first resistor, coupled to the first linearization transistor, the second adaptive bias circuit includes a second linearization circuit that includes a second linearization transistor and a second resistor, coupled to the second linearization transistor, an aspect ratio of the first linearization transistor is higher than an aspect ratio of the second linearization transistor, and a resistance of the first resistor is lower than a resistance of the second resistor.

Example 19 provides the PA arrangement according to any one of examples 9-18, where the first PA segment further includes a first coupling circuit, configured to couple the first bias signal to the first PA (e.g., to the input of the first PA), the second PA segment further includes a second coupling circuit, configured to couple the second bias signal to the second PA (e.g., to the input of the second PA), and a coupling strength of the first coupling circuit is smaller than a coupling strength of the second coupling circuit.

Example 20 provides the PA arrangement according to any one of examples 9-19, where the first PA segment further includes a first resistor, configured to couple the first bias signal to the first PA (e.g., to the input of the first PA), the second PA segment further includes a second resistor, configured to couple the second bias signal to the second PA (e.g., to the input of the second PA), and a resistance of the first resistor is larger than a resistance of the second resistor, which may result in a low slope of the bias signal vs input power for the first PA and a high slope of the bias signal vs input power for the second PA.

Example 21 provides the PA arrangement according to any one of examples 9-20, where the first PA segment further includes a first coupling circuit, configured to couple the first bias signal to the first PA (e.g., to the input of the first PA), the second PA segment further includes a second coupling circuit, configured to couple the second bias signal to the second PA (e.g., to the input of the second PA), and either the first coupling circuit is configured so that an impedance of the first coupling circuit is dependent on the power of the first PA input signal or the second coupling circuit is configured so that an impedance of the second coupling circuit is dependent on the power of the second PA input signal, or both the first and the second coupling circuits are configured in this manner.

Example 22 provides the PA arrangement according to example 21, where, when the first coupling circuit is configured so that the impedance of the first coupling circuit is dependent on the power of the first PA input signal, the first coupling circuit is configured so that, when the power of the first PA input signal is at a first power level, the impedance of the first coupling circuit is a first impedance, and, when the power of the first PA input signal is at a second power level, the second power level being higher than first power level, the impedance of the first coupling circuit is a second impedance, lower than the first impedance. Similarly, when the second coupling circuit is configured so that the impedance of the second coupling circuit is dependent on the power of the second PA input signal, the second coupling circuit is configured so that, when the power of the second PA input signal is at a third power level, the impedance of the second coupling circuit is a third impedance, and, when the power of the second PA input signal is at a fourth power level, the fourth power level being higher than third power level, the impedance of the second coupling circuit is a fourth impedance, lower than the third impedance.

Example 23 provides the PA arrangement according to any one of examples 9-22, where the PA arrangement further includes a first output inductor (e.g., inductor Lout_1) included in the first PA segment and a second output inductor (e.g., inductor Lout_2) included in the second PA segment, the first output inductor is coupled to the output of the first PA, the second output inductor is coupled to the output of the second PA, and an inductance of the second output inductor is smaller than an inductance of the first output inductor.

Example 24 provides the PA arrangement according to any one of examples 9-23, where the first PA includes one or more stacked first transistors, the second PA includes one or more stacked second transistors, and a size of each of the one or more stacked first transistors is smaller than a size of each of the one or more stacked second transistors.

Example 25 provides the PA arrangement according to any one of examples 9-24, where the first PA includes m stacked transistors, the second PA includes n stacked transistors, and each of m and n is an integer greater than zero and m is smaller than n.

Example 26 provides the PA arrangement according to any one of examples 9-25, where the first PA includes one or more stacked first transistors, the second PA includes one or more stacked second transistors, and a supply voltage provided to each of the one or more stacked first transistors is smaller than a supply voltage provided to each of the one or more stacked second transistors.

Variations and Implementations

While embodiments of the present disclosure were described above with references to exemplary implementations as shown in FIGS. 1-18, a person skilled in the art will realize that the various teachings described above are applicable to a large variety of other implementations. For example, descriptions provided herein are applicable not only to 5G systems, which provide one example of wireless communication systems (in particular, an example of high-frequency/short wavelength spectrum, e.g., with frequencies in the range between about 20 and 60 GHz, corresponding to wavelengths in the range between about 5 and 15 millimeters), but also to other wireless communication systems such as, but not limited to, Wi-Fi technology (e.g., a frequency band of 2.4 GHz, corresponding to a wavelength of about 12 cm, or a frequency band of 5.8 GHz, spectrum, corresponding to a wavelength of about 5 cm) or Bluetooth technology (e.g., a frequency band from about 2.4 to about 2.485 GHz, corresponding to a wavelength of about 12 cm). In yet another example, descriptions provided herein are applicable not only to wireless communication systems, but also to any other systems where amplifiers may be used, such as radar systems, automotive radar, and cable communication systems (e.g., cable television systems, etc.).

In certain contexts, the features discussed herein can be applicable to automotive systems, medical systems, scientific instrumentation, wireless and wired communications, radio, radar, and digital-processing-based systems.

In the discussions of the embodiments above, components of a system, such as phase shifters, frequency mixers, transistors, resistors, capacitors, amplifiers, and/or other components can readily be replaced, substituted, or otherwise modified in order to accommodate particular circuitry needs. Moreover, it should be noted that the use of complementary electronic devices, hardware, software, etc., offer an equally viable option for implementing the teachings of the present disclosure related to segmented PA arrangements with feedforward adaptive bias circuits as described herein.

Parts of various systems for implementing segmented PA arrangements with feedforward adaptive bias circuits, as proposed herein, can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed-signal domain. In some instances, the processor may be configured to carrying out the functions described herein by executing one or more instructions stored on a non-transitory computer-readable storage medium.

In one example embodiment, any number of electrical circuits of the present drawings may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of DSPs, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the present drawings may be implemented as stand-alone modules (e.g., a device with associated components and circuitry configured to perform a specific application or function) or implemented as plug-in modules into application specific hardware of electronic devices. Note that embodiments of the present disclosure may be readily included in a SoC package, either in part, or in whole. An SoC represents an IC that integrates components of a computer or other electronic system into a single chip. It may contain digital, analog, mixed-signal, and often RF functions: all of which may be provided on a single chip substrate. Other embodiments may include a multi-chip-module (MCM), with a plurality of separate ICs located within a single electronic package and configured to interact closely with each other through the electronic package.

Furthermore, while some drawings may illustrate, and the description above may indicate, that the circuits disclosed herein may include various transistors of the N-type of transistors (e.g., NMOS or NPN transistors), in further embodiments, any of these transistors may be implemented as P-type transistors (e.g., PMOS or PNP transistors). For such embodiments, descriptions provided above are still applicable, except that for the P-type transistors, the supply voltage Vs described above for the N-type transistors is to be replaced with the ground potential Vgnd, and vice versa.

It is also imperative to note that all the specifications, dimensions, and relationships outlined herein (e.g., the number of components shown in the systems of FIGS. 1-18) have only been offered for purposes of example and teaching only. Such information may be varied considerably without departing from the spirit of the present disclosure, or the scope of the appended claims. It should be appreciated that the system can be consolidated in any suitable manner. Along similar design alternatives, any of the illustrated circuits, components, modules, and elements of the present drawings may be combined in various possible configurations, all of which are clearly within the broad scope of this specification. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

It is also important to note that the functions related to realizing segmented PA arrangements with feedforward adaptive bias circuits as proposed herein illustrate only some of the possible functions that may be executed by, or within, RF systems. Some of these operations may be deleted or removed where appropriate, or these operations may be modified or changed considerably without departing from the scope of the present disclosure. Substantial flexibility is provided by embodiments described herein in that any suitable arrangements, chronologies, configurations, and timing mechanisms may be provided without departing from the teachings of the present disclosure.

The invention claimed is:

1. A power amplifier (PA) arrangement, comprising:
a first PA segment, comprising a first PA and a first adaptive bias circuit to generate a first bias signal for the first PA, the first bias signal having a first DC component, at least one first tone component, and at least one harmonic of the at least one first tone component;
a second PA segment, comprising a second PA and a second adaptive bias circuit to generate a second bias signal for the second PA, the second bias signal having a second DC component, at least one second tone component, and at least one harmonic of the at least one second tone component, where an amplitude of the at least one harmonic of the at least one first tone component is smaller than an amplitude of the at least one harmonic of the at least one second tone component; and
a power splitting circuit, to split an input signal for the PA arrangement into a first PA input signal, provided to the first PA segment, and a second PA input signal, provided to the second PA segment, wherein the power splitting circuit includes a first capacitor coupled between an input to the PA arrangement and an input to the first PA, and further includes a second capacitor coupled between the input to the PA arrangement and an input to the second PA, wherein a capacitance of the second capacitor is smaller than a capacitance of the first capacitor.

2. The PA arrangement according to claim 1, wherein:
the first PA includes m transistors,
the second PA includes n transistors, and
each of m and n is an integer greater than zero and m is smaller than n.

3. The PA arrangement according to claim 2, wherein a supply voltage provided to each of the m transistors is smaller than a supply voltage provided to each of the n transistors.

4. A power amplifier (PA) arrangement, comprising:
a first PA segment, comprising a first PA and a first adaptive bias circuit to generate a first bias signal for the first PA;
a second PA segment, comprising a second PA and a second adaptive bias circuit to generate a second bias signal for the second PA, where the first PA includes m transistors, the second PA includes n transistors, each of m and n is an integer greater than zero and m is smaller than n, and a supply voltage provided to each of the m transistors is smaller than a supply voltage provided to each of the n transistors;
a power splitting circuit, to split an input signal for the PA arrangement into a first PA input signal, provided to the first PA segment, and a second PA input signal, provided to the second PA segment, where a power of the first PA input signal is greater than a power of the second PA input signal; and
a combiner, to combine a first PA output signal and a second PA output signal to generate a combined output signal,
wherein:
the first adaptive bias circuit is to generate the first bias signal that is dependent on a power of the input signal in that an amplitude of the first bias signal is at a constant first value when the power of the input signal is equal to or smaller than a first threshold power, and increases at a first rate when the power of the input signal is greater than the first threshold power,
the second adaptive bias circuit is to generate the second bias signal that is dependent on the power of the input signal in that an amplitude of the second bias signal is at a constant second value when the power of the input signal is equal to or smaller than a second threshold power, and increases at a second rate when the power of the input signal is greater than the second threshold power,
the constant first value is greater than the constant second value, and
the second rate is higher than the first rate.

5. The PA arrangement according to claim 4, wherein:
the first PA output signal has a first gain expansion for output powers of the first PA output signal below a first value,
the first PA output signal has a first gain compression for output powers of the first PA output signal above the first value,
the second PA output signal has a second gain expansion for output powers of the second PA output signal below a second value,
the second PA output signal has a second gain compression for output powers of the second PA output signal above the second value,
the second gain expansion is greater than the first gain expansion, and
the second value is greater than the first value.

6. The PA arrangement according to claim 5, wherein:
the combined output signal has a third gain expansion for output powers of the combined output signal below a third value, and
the combined output signal has a gain compression for output powers of the combined output signal above the third value,
where the third value is greater than the first value and smaller than the second value.

7. A power amplifier (PA) arrangement, comprising:
a first PA segment, comprising a first PA and a first adaptive bias circuit to generate a first bias signal for the first PA, the first bias signal having a first DC component, at least one first tone component, and at least one harmonic of the at least one first tone component;
a second PA segment, comprising a second PA and a second adaptive bias circuit to generate a second bias signal for the second PA, the second bias signal having a second DC component, at least one second tone component, and at least one harmonic of the at least one second tone component;
a power splitting circuit, to split an input signal for the PA arrangement into a first PA input signal, provided to the first PA, and a second PA input signal, provided to the second PA, where a power of the first PA input signal is greater than a power of the second PA input signal; and
a combiner, to combine a first PA output signal and a second PA output signal to generate a combined output signal, where the first PA output signal is a signal generated by the first PA amplifying a signal based on the first PA input signal while being biased by the first bias signal, and where the second PA output signal is a signal generated by the second PA amplifying a signal based on the second PA input signal while being biased by the second bias signal.

8. The PA arrangement according to claim 7, wherein each of the first adaptive bias circuit and the second adaptive bias circuit is a feedforward circuit.

9. The PA arrangement according to claim 7, wherein:
the first adaptive bias circuit is to generate the first bias signal that is dependent on a power of the input signal in that an amplitude of the first bias signal is at a constant first value when the power of the input signal is equal to or smaller than a first threshold power, and increases at a first rate when the power of the input signal is greater than the first threshold power,
the second adaptive bias circuit is to generate the second bias signal that is dependent on the power of the input signal in that an amplitude of the second bias signal is at a constant second value when the power of the input signal is equal to or smaller than a second threshold power, and increases at a second rate when the power of the input signal is greater than the second threshold power,
the constant first value is greater than the constant second value, and
the second rate is higher than the first rate.

10. The PA arrangement according to claim 7, wherein:
the first adaptive bias circuit is to generate the first bias signal that provides:
  a first gain expansion of the first PA output signal for output powers of the first PA output signal below a first value, and
  a first gain compression of the first PA output signal for output powers of the first PA output signal above the first value,
the second adaptive bias circuit is to generate the second bias signal that provides:
  a second gain expansion of the second PA output signal for output powers of the second PA output signal below a second value, and
  a second gain compression of the second PA output signal for output powers of the second PA output signal above the second value,
the second gain expansion is greater than the first gain expansion, and
the second value is greater than the first value.

11. The PA arrangement according to claim 10, wherein the first adaptive bias circuit is to adapt the first bias signal in combination with the second adaptive bias circuit adapting the second bias signal to provide:
a third gain expansion of the combined output signal for output powers of the combined output signal below a third value, and
a gain compression of the combined output signal for output powers of the combined output signal above the third value,
where the third value is greater than the first value and smaller than the second value.

12. The PA arrangement according to claim 11, wherein:
a gain of the combined output signal for output powers of the combined output signal below the third value is greater than a gain of the first PA output signal for output powers of the first PA output signal below the first value, and
a gain of the first PA output signal for output powers of the first PA output signal below the first value is greater than a gain of the second PA output signal for output powers of the second PA output signal below the second value.

13. The PA arrangement according to claim 7, wherein:
the power splitting circuit includes a first capacitor in the first PA segment and a second capacitor in the second PA segment,
the first capacitor is coupled between the input signal for the PA arrangement and an input to the first PA,
the second capacitor is coupled between the input signal for the PA arrangement and an input to the second PA, and
a capacitance of the second capacitor is smaller than a capacitance of the first capacitor.

14. The PA arrangement according to claim 13, wherein:
the power splitting circuit further includes a first inductor in the first PA segment and a second inductor in the second PA segment,
the first inductor is coupled between an input transistor of the first PA and a first reference voltage,
the second inductor is coupled between an input transistor of the second PA and a second reference voltage, and
an inductance of the second inductor is smaller than an inductance of the first inductor.

15. The PA arrangement according to claim 7, wherein:
the first adaptive bias circuit includes a first linearization circuit that includes a first linearization transistor and a first resistor, coupled to the first linearization transistor,
the second adaptive bias circuit includes a second linearization circuit that includes a second linearization transistor and a second resistor, coupled to the second linearization transistor,
an aspect ratio of the first linearization transistor is higher than an aspect ratio of the second linearization transistor, and
a resistance of the first resistor is lower than a resistance of the second resistor.

16. The PA arrangement according to claim 7, wherein:
the first PA segment further includes a first coupling circuit to couple the first bias signal to the first PA,
the second PA segment further includes a second coupling circuit to couple the second bias signal to the second PA, and
a coupling strength of the first coupling circuit is smaller than a coupling strength of the second coupling circuit.

17. The PA arrangement according to claim 7, wherein:
the first PA segment further includes a first coupling circuit to couple the first bias signal to the first PA,
the second PA segment further includes a second coupling circuit to couple the second bias signal to the second PA, and
at least one of:
  an impedance of the first coupling circuit is dependent on the power of the first PA input signal, and an impedance of the second coupling circuit is dependent on the power of the second PA input signal.

18. The PA arrangement according to claim 17, wherein:
when the impedance of the first coupling circuit is dependent on the power of the first PA input signal, then:
  when the power of the first PA input signal is at a first power level, the impedance of the first coupling circuit is a first impedance, and
  when the power of the first PA input signal is at a second power level, the second power level being higher than first power level, the impedance of the first coupling circuit is a second impedance, lower than the first impedance; and
when the impedance of the second coupling circuit is dependent on the power of the second PA input signal, then:
  when the power of the second PA input signal is at a third power level, the impedance of the second coupling circuit is a third impedance, and
  when the power of the second PA input signal is at a fourth power level, the fourth power level being higher than third power level, the impedance of the second coupling circuit is a fourth impedance, lower than the third impedance.

19. The PA arrangement according to claim 7, wherein:
the PA arrangement further includes a first output inductor in the first PA segment and a second output inductor in the second PA segment,
the first output inductor is coupled to an output of the first PA,
the second output inductor is coupled to an output of the second PA, and
an inductance of the second output inductor is smaller than an inductance of the first output inductor.

20. The PA arrangement according to claim 7, wherein:
the first PA includes one or more first transistors,
the second PA includes one or more second transistors,
a size of each of the one or more first transistors is smaller than a size of each of the one or more second transistors, and
a supply voltage provided to each of the one or more first transistors is smaller than a supply voltage provided to each of the one or more second transistors.

21. A power amplifier arrangement, comprising:
a power splitter comprising a power splitter signal input for receiving a signal to be amplified, a first power splitter output and a second power splitter output, wherein the power splitter is to provide different amounts of power from an input signal received at the power splitter signal input to the first and second power splitter outputs;
a first power amplifier having a first power amplifier input and a first power amplifier output, the first power amplifier input being coupled to the first power splitter output;
a second power amplifier having a second power amplifier input and a second power amplifier output, the second power amplifier input being coupled to the second power splitter output, wherein the first power amplifier output and the second power amplifier output are coupled to each other and to a signal output of the power amplifier arrangement, and wherein the second power amplifier is a different class amplifier than the first power amplifier;
a first adaptive bias circuit to generate a first bias signal for the first power amplifier, the first bias signal including at least one first tone component and at least one harmonic of the at least one first tone component; and
a second adaptive bias circuit to generate a second bias signal for the second power amplifier.

22. The power amplifier arrangement according to claim 21, wherein the power splitter includes:
a first transmission path including a first impedance coupling the power splitter signal input to the first power splitter output; and
a second transmission path including a second impedance coupling the power splitter signal input to the second power splitter output, the first and second impedances being different.

23. The power amplifier arrangement according to claim 22, wherein the first transmission path includes a first capacitor, and wherein said second transmission path includes a second capacitor.

24. The power amplifier arrangement according to claim 22, wherein the first impedance is lower than said second impedance.

25. The power amplifier arrangement according to claim 21, wherein the first power amplifier is a class-B power amplifier, and the second power amplifier is a class-C power amplifier.

26. A radio frequency system with a segmented power amplifier arrangement, comprising:
a phased antenna array comprising a plurality of antenna elements; and
a power amplifier arrangement to drive an antenna element of the plurality of antenna elements, the power amplifier arrangement comprising:
  a power splitter comprising a power splitter signal input for receiving a signal to be amplified, a first power splitter output and a second power splitter output, wherein the power splitter is to provide different amounts of power from an input signal received at the power splitter signal input to the first and second power splitter outputs;
  a first power amplifier having a first power amplifier input and a first power amplifier output, the first power amplifier input being coupled to the first power splitter output;
  a second power amplifier having a second power amplifier input and a second power amplifier output, the second power amplifier input being coupled to the second power splitter output, wherein the first power amplifier output and the second power amplifier output are coupled to each other and to a signal output of the power amplifier arrangement, and wherein the second power amplifier is a different class amplifier than the first power amplifier; and
  an adaptive bias circuit to generate a bias signal for the first power amplifier, the bias signal including at least first tone component and at least one harmonic of the at least one tone component.

27. The power amplifier arrangement according to claim 21, wherein:
the first bias signal further includes a first direct current (DC) component, and
the second bias signal includes a second DC component and at least one second tone component.

28. The power amplifier arrangement according to claim 27, wherein the second bias signal further includes at least one harmonic of the at least one second tone component.

29. The power amplifier arrangement according to claim 21, wherein:

the first adaptive bias circuit is to generate the first bias signal that provides:
- a first gain expansion of a signal at the first power amplifier output for output powers of the signal at the first power amplifier output below a first value, and
- a first gain compression of the signal at the first power amplifier output for output powers of the signal at the first power amplifier output above the first value, the second adaptive bias circuit is to generate the second bias signal that provides:
- a second gain expansion of a signal at the second power amplifier output for output powers of the signal at the second power amplifier output below a second value, and
- a second gain compression of the signal at the second power amplifier output for output powers of the signal at the second power amplifier output above the second value, the second gain expansion is greater than the first gain expansion, and the second value is greater than the first value.

* * * * *